(12) United States Patent
Isikawa

(10) Patent No.: US 7,648,863 B2
(45) Date of Patent: Jan. 19, 2010

(54) SEMICONDUCTOR DEVICE AND MANUFACTURING METHOD THEREOF

(75) Inventor: Akira Isikawa, Kanagawa (JP)

(73) Assignee: Semiconductor Energy Laboratory Co., Ltd., Atsugi-shi, Kanagawa-Ken (JP)

( * ) Notice: Subject to any disclaimer, the term of this patent is extended or adjusted under 35 U.S.C. 154(b) by 0 days.

(21) Appl. No.: 12/183,087

(22) Filed: Jul. 31, 2008

(65) Prior Publication Data

US 2008/0299737 A1    Dec. 4, 2008

Related U.S. Application Data

(62) Division of application No. 11/328,257, filed on Jan. 10, 2006, now Pat. No. 7,422,933, which is a division of application No. 10/668,969, filed on Sep. 24, 2003, now Pat. No. 7,009,262.

(30) Foreign Application Priority Data

Sep. 27, 2002  (JP) ............................. 2002-284001

(51) Int. Cl.
*H01L 21/00* (2006.01)
(52) U.S. Cl. ................. 438/149; 257/E51.005
(58) Field of Classification Search ........... 438/149, 438/197; 257/E29.151, E51.005
See application file for complete search history.

(56) References Cited

U.S. PATENT DOCUMENTS

| | | | |
|---|---|---|---|
| 5,049,514 A | 9/1991 | Mori | |
| 5,079,617 A | 1/1992 | Yoneda | |
| 5,276,347 A | 1/1994 | Wei et al. | |
| 5,413,961 A | 5/1995 | Kim | |
| 5,432,108 A | 7/1995 | Lee | |
| 5,445,987 A | 8/1995 | Kuroda et al. | |
| 5,459,090 A | 10/1995 | Yamazaki et al. | |
| 5,473,184 A | 12/1995 | Murai | |
| 5,687,113 A | 11/1997 | Papadas et al. | |
| 5,767,006 A | 6/1998 | Lee | |
| 6,180,502 B1 | 1/2001 | Liang | |

(Continued)

FOREIGN PATENT DOCUMENTS

JP    63-275181    11/1988

(Continued)

OTHER PUBLICATIONS

S. Kishino, "Novel fundamental of semiconductor device" Ohmesha LTD, 1995, pp. 201-207.

(Continued)

*Primary Examiner*—Thao P. Le
(74) *Attorney, Agent, or Firm*—Nixon Peabody, LLP; Jeffrey L. Costellia

(57) ABSTRACT

A manufacturing method of a semiconductor device which can decrease the degradation of an element due to plasma in the LDD formation process is provided. The degradation of an element due to plasma is decreased by forming an element having an LDD structure according to a manufacturing method of a semiconductor device using a hard mask. Covering the substrate by an electrically conductive film allover, the density of electric charge accumulated in a gate electrode in the plasma process such as anisotropic etching can be reduced, and the degradation due to plasma process can be reduced.

14 Claims, 14 Drawing Sheets

U.S. PATENT DOCUMENTS

| | | |
|---|---|---|
| 6,274,887 B1 | 8/2001 | Yamazaki et al. |
| 6,297,093 B1 | 10/2001 | Borel et al. |
| 6,335,231 B1 | 1/2002 | Yamazaki et al. |
| 6,392,628 B1 | 5/2002 | Yamazaki et al. |
| 6,495,406 B1 | 12/2002 | Honeycutt |
| 6,528,854 B1 | 3/2003 | Yoshida et al. |
| 6,559,036 B1 | 5/2003 | Ohtani et al. |
| 6,593,634 B2 | 7/2003 | Ohmi et al. |
| 6,613,666 B2 | 9/2003 | Ma |
| 6,692,984 B2 | 2/2004 | Yonezawa et al. |
| 7,172,931 B2 | 2/2007 | Monoe et al. |
| 2001/0030322 A1 | 10/2001 | Yamazaki et al. |
| 2001/0035526 A1 | 11/2001 | Yamazaki et al. |
| 2001/0041392 A1 | 11/2001 | Suzawa et al. |
| 2001/0052950 A1 | 12/2001 | Yamazaki et al. |
| 2001/0055841 A1 | 12/2001 | Yamazaki et al. |
| 2002/0000551 A1 | 1/2002 | Yamazaki |
| 2002/0006705 A1 | 1/2002 | Suzawa et al. |
| 2002/0008797 A1 | 1/2002 | Yamazaki |
| 2002/0016028 A1 | 2/2002 | Arao et al. |
| 2002/0024051 A1 | 2/2002 | Yamazaki |
| 2002/0028544 A1 | 3/2002 | Fujimoto |
| 2002/0070382 A1 | 6/2002 | Yamazaki et al. |
| 2002/0102783 A1 | 8/2002 | Fujimoto et al. |
| 2002/0110941 A1 | 8/2002 | Yamazaki |
| 2002/0158288 A1 | 10/2002 | Yamazaki et al. |
| 2002/0182833 A1 | 12/2002 | Yang |
| 2003/0094614 A1 | 5/2003 | Yamazaki et al. |
| 2003/0197231 A1 | 10/2003 | Ohmi et al. |
| 2004/0063256 A1 | 4/2004 | Ishikawa |
| 2005/0247937 A1 | 11/2005 | Yamazaki et al. |

FOREIGN PATENT DOCUMENTS

| | | |
|---|---|---|
| JP | 2001-298192 A | 10/2001 |

OTHER PUBLICATIONS

U.S. Appl. No. 10/670,310, filed Sep. 26, 2003, Inventor Akira Ishikawa (English Specification with Drawings and Claims).

S. Ogura et al., "Design and Characteristic of the Lightly Doped Drain-Source (LDD) Insulated Gate Field-Effect Transistor". IEEE Transactions on Electron Devices, vol. ED-27, No. 8, 1980. pp. 1359-1367.

Huang et al., "A Novel Submicron LDD Transistor with Inverse-T Gate Structure", IEDM, 1986, pp. 742-745, 1986.

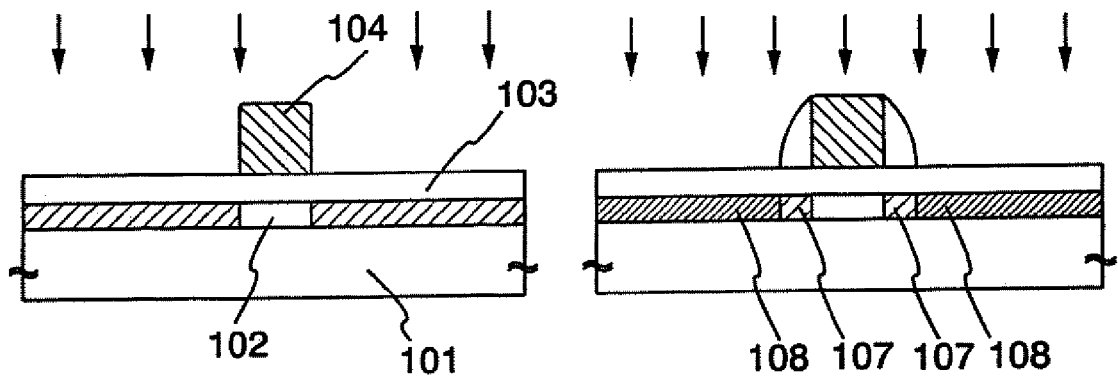
FIG. 1A  PRIOR ART
FIG. 1D  PRIOR ART
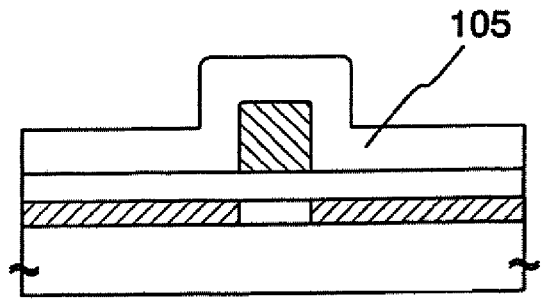
FIG. 1B  PRIOR ART
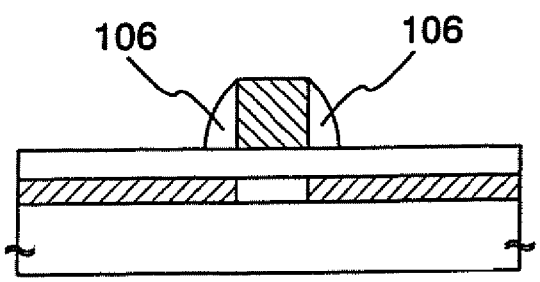
FIG. 1C  PRIOR ART

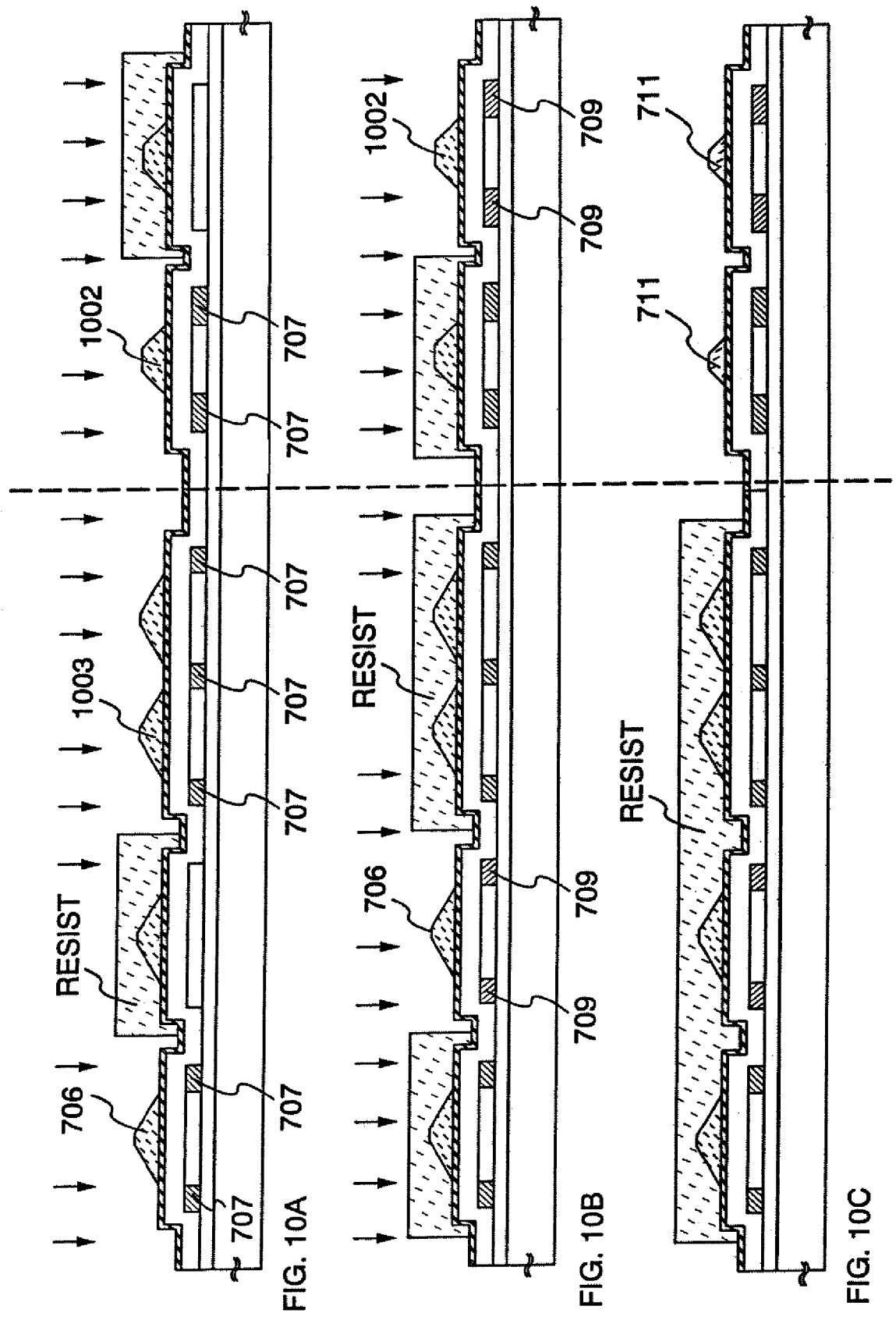

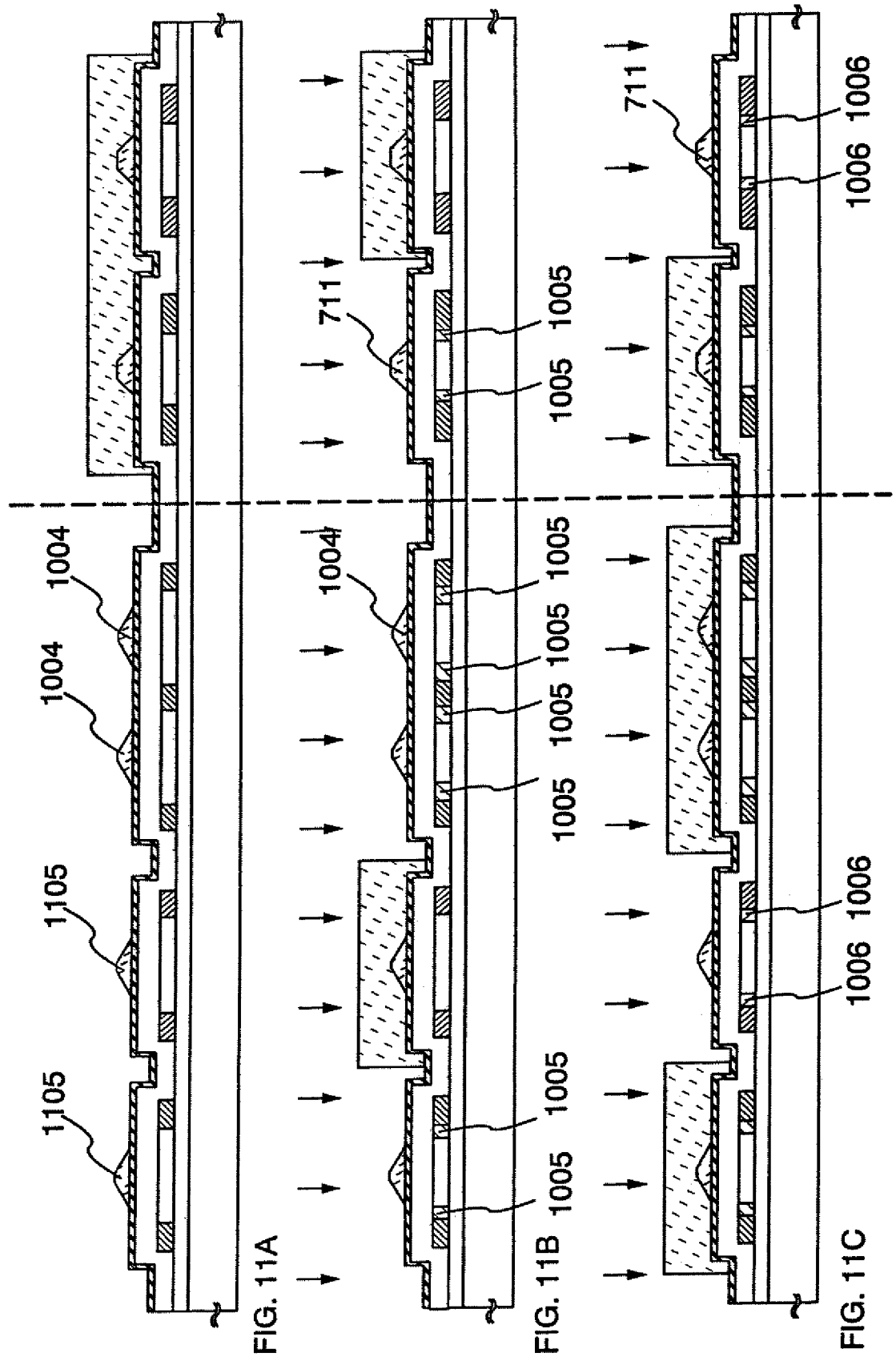

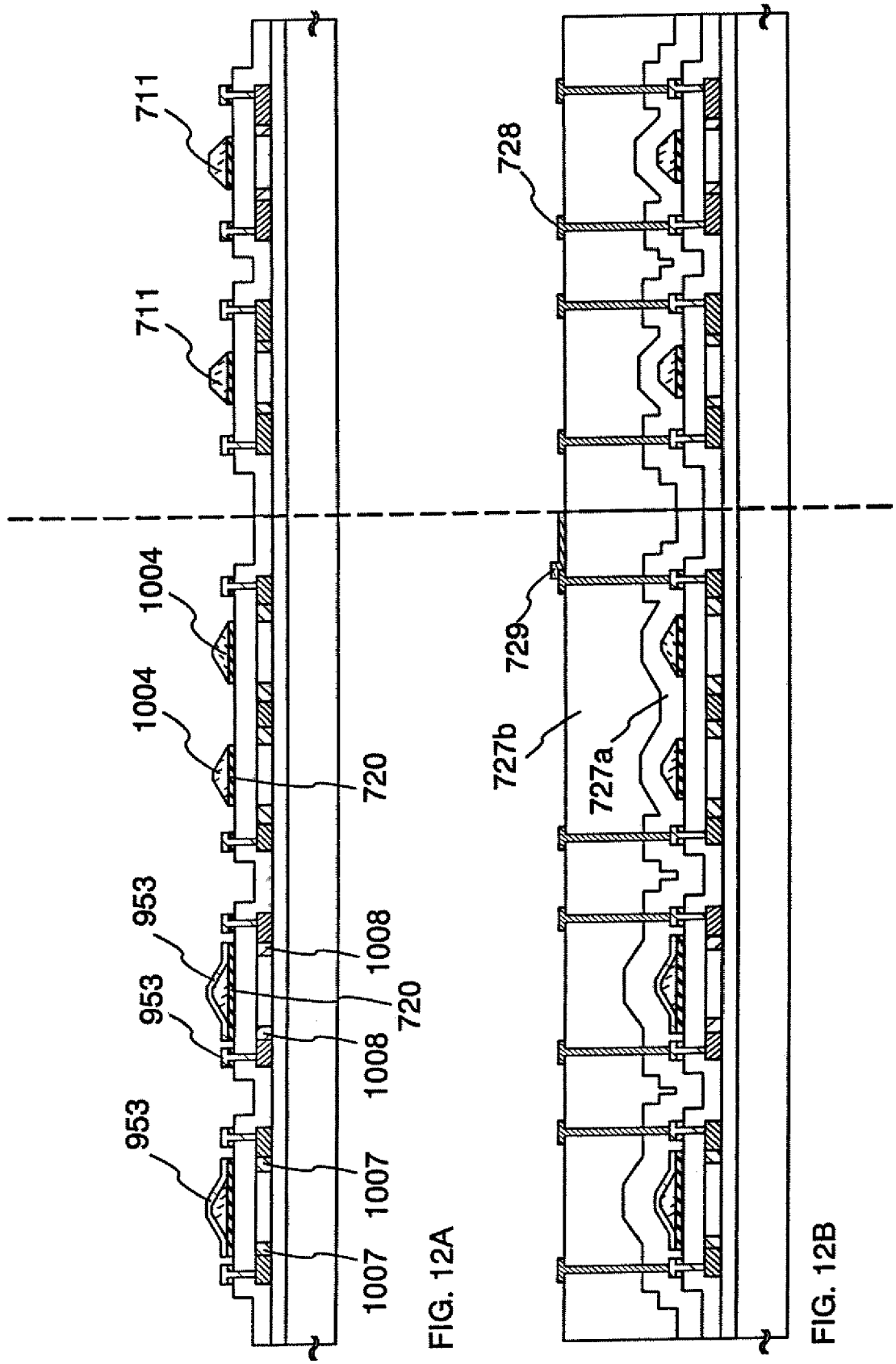

SEMICONDUCTOR DEVICE AND MANUFACTURING METHOD THEREOF

CROSS-REFERENCE TO RELATED APPLICATION

This application is a division of U.S. application Ser. No. 11/328,257, filed Jan. 10, 2006, now U.S. Pat. No. 7,422,933, which is a division of U.S. application Ser. No. 10/668,969, filed Sep. 24, 2003, now U.S. Pat. No. 7,009,262.

BACKGROUND OF THE INVENTION

1. Field of the Invention

The present invention relates to a semiconductor device and a manufacturing method thereof and specially, the present invention relates to a semiconductor device in which an LDD (Lightly Doped Drain) is formed in a self-aligning manner and a manufacturing method thereof.

2. Description of the Related Art

Recently, in the field of an image display device, the development of a system-on-panel incorporating logical circuits such as a memory circuit and a clock generating circuit, besides a pixel, a driver circuit and the like, on a glass substrate has attracted attention. The technical development of manufacturing a TFT with high switching speed on a glass substrate is required to realize high-speed operation for driver circuit and logical circuit. A TFT with high switching speed is manufactured by using a semiconductor film with fewer crystal defects and by miniaturizing an element size.

Even if an element size is miniaturized proportionally, drive voltage cannot always be reduced proportionally in order to keep signal speed and response speed. Consequently, the vicinity of a drain region becomes high field by miniaturizing an element size of a MOS transistor. Accordingly, an electron and a hole having high energy, which are referred to as hot carriers are generated and caught in a gate insulating film. And it is known that this will cause a degradation phenomenon such as a fluctuation of threshold level.

It is effective to apply an LDD (Lightly Doped Drain) structure as an element structure. The LDD structure is formed by providing a low concentration impurity region (hereafter referred to as an LDD) in a drain end which is contact with a channel. As low concentration impurities, an n-type impurity is used in the case of an n-channel element and a p-type impurity is used in the case of a p-channel element. In this manner, electric field in the vicinity of the drain region is relieved and the occurrence of $ hot carriers is controlled by making gradient impurity concentration in the channel-drain junction. (For example, Reference. 1, S. Kishino "Novel fundamental of semiconductor device" Ohmsha, LTD. 1995. P201-207)

A degradation phenomenon caused by hot carriers is generated not only in a MOS transistor but also in a TFT. But it can also be prevented by applying an LDD structure as an element structure of a TFT as well as a MOS transistor.

The formation method of a general LDD structure in MOS transistor is explained with reference to FIGS. 1A to 1D, but the process to element separation and the process after the formation of an LDD are omitted here.

A gate insulating film 103 is formed on a semiconductor film 102 which has an isolated element. Next, a gate electrode 104 formed of polysilicon is formed on the gate insulating film 103. After fabricating the gate electrode 104 into a desired shape, ions at low concentration are doped into the semiconductor film 102. Next, a silicon oxide film 105 which is excellent in isotropic step coverage is formed on the gate electrode 104. Then, sidewalls 106 is formed by performing anisotropic etching in vertical direction to leave the silicon oxide 105 only on the sidewalls of the gate electrode. A source (or a drain) 108 is formed by doping ions at high concentration in the semiconductor film 102 so that ions do not penetrate the sidewalls 106. The ions at high concentration are not doped into the lower portion of the sidewalls 106, and then the lower portion of the sidewalls 106 is to be LDDs 107.

As described above, an LDD is formed in a self-aligning manner without patterning by using a sidewall. With miniaturization in an element size, there is a case in which the process in the scope of exceeding alignment accuracy of patterning is required. In this case, an LDD can be formed with higher precision in a self-aligning manner which does not involve patterning. Hence, the above method is used when alignment accuracy is higher in the case of using a self-aligning manner in the formation of an LDD.

An LDD can be formed in a TFT in the same way as a MOS transistor. An insulating material such as a glass substrate is used for forming a TFT. Therefore, a TFT is easily charged, and easily suffered damage from plasma especially in anisotropic etching to form sidewalls. In the element suffered damage from plasma, electrical charge in a gate insulating film and energy level in an interface between a semiconductor layer and a gate insulating layer are generated, and, as a result, deterioration such as fluctuation of threshold level is caused. Such damage from plasma generated in the formation process of an LDD is resulted from the difficulty in discharging electric charge accumulated in a gate electrode of which surface area is reduced by processing into a desired shape, and results in considerable impact on an element characteristic. Therefore, the damage from plasma is increased due to the increased charge density which is to be accumulated in the gate electrode as decreasing the surface area of the gate electrode by miniaturization of an element size, and as decreasing the thickness of the gate insulating film.

However, the miniaturization of an element size is required more and more to manufacture a TFT with high switching speed which is fundamental to an element for logical operation circuit, and to obtain higher integration. Additionally, it is difficult to repair the damage from heat treatment since a substrate made from a glass substrate which does not withstand very high temperature is used for low manufacturing cost. Consequently, the development of manufacturing method of a TFT having an LDD structure, which can take advantage of self aligning manner having high manufacturing accuracy and decrease the damage from the plasma as much as possible is needed.

SUMMARY OF THE INVENTION

According to the present invention, it is an object of the present invention to provide a manufacturing method of a semiconductor device which can form an LDD in self aligning manner and minimize degradation from plasma as much as possible, and also a semiconductor device manufactured by that method.

In this specification, "resist mask" is defined as a mask formed from photo resist whereas a mask formed from a material that is not photo resist is referred to as "hard mask". A mask in the description is a resist mask unless clearly stated that it is a hard mask. The length of an LDD in the direction of the channel length is referred to as LDD length.

According to the present invention, a method of manufacturing a semiconductor device is characterized in that the density of electric charges generated in a plasma process such as anisotropic etching is lowered by covering the entire substrate with a conductive film during the plasma process, thereby greatly reducing damage brought by plasma that is generated in an LDD formation step.

According to, the present invention, a method of manufacturing a semiconductor device is characterized by including: a step of forming a conductive film on a gate insulating film; a step of forming a first hard mask on the conductive film; a step of doping a semiconductor film with an impurity in high concentration while masking the film with the first hard mask; a step of forming a second hard mask by making the first hard mask shrink through etching after the high concentration impurity doping; a step of doping the semiconductor film with an impurity in low concentration while masking the film with the second hard mask; and a step of forming a gate electrode by processing the conductive film while masking the film with the second hard mask after the low concentration impurity doping.

As shown in FIGS. 2A to 2D, a semiconductor film 202 is formed to have an island-like shape on an insulating substrate 201. After element separation, an insulating film is formed on the semiconductor film 202 to serve as a gate insulating film 203. Subsequently, a conductive film 204 is formed on the insulating film 203.

Formed on the conductive film 204 is a hard mask 205. The hard mask 205 is obtained by forming a hard mask film on the conductive film 204 and then processing the film using a resist mask. In processing the hard mask film using the resist mask, the hard mask obtains an island-like shape. Side walls of the hard mask have an angle of inclination of 90° or less, or form arc shapes. The material of the hard mask film may be conductive or insulative provided that the material has high etching selectivity with respect to the conductive film 204.

Masked with the hard mask 205, the semiconductor film 202 is doped with an impurity in high concentration through the insulating film 203 and the conductive film 204. Thus formed are impurity regions 206, one of which serves as a source and the other of which serves as a drain.

Next, the hard mask 205 is selectively etched away so that the hard mask 205 shrinks and creates a hard mask 207. The LDD length is determined by how much the hard mask 205 shrinks in the horizontal direction.

Masked with the hard mask 207. The semiconductor film 202 is doped with an impurity in low concentration through the insulating film 203 and the conductive film 204. Thus formed are LDDs 208.

The LDDs 208 are thus formed by a self-aligning manner which does not need a patterning step. Employing wet etching in making the hard mask 205 shrink prevents damage by plasma. Even when dry etching is used to make the hard mask 205 shrink, damage by plasma is greatly reduced because the conductive film 204 covers the entire substrate to present a large surface area, which lowers the density of electric charges accumulated in the conductive film 204 during the etching.

After the LDDs 208 are formed, the conductive film 204 is processed while masked with the hard mask 207. Obtained as a result is a gate electrode 209.

With the method described above, a semiconductor device in which an LDD is formed in a self-aligning manner and damage by plasma is greatly reduced can be manufactured.

According to the present invention, a method of manufacturing a semiconductor device is characterized by including: a step of forming a conductive film on a gate insulating film a step of forming a first hard mask on the conductive film; a step of doping a semiconductor film with an impurity in high concentration while masking the film with the first hard mask; a step of forming a second hard mask by making the first hard mask shrink through etching after the high concentration impurity doping; a step of forming a gate electrode by processing the conductive film while masking the film with the second hard mask; and a step of doping the semiconductor film with an impurity in low concentration while masking the film with the second hard mask after the formation of the gate electrode.

Another way to form the LDD is to dope the semiconductor film with a second impurity after the conductive film is processed while masking the semiconductor film with the second hard mask. The insulating film may be left or removed following the processing of the conductive film. If the insulating film is left, then the semiconductor film is doped with the second impurity through the insulating film. This method too makes it possible to manufacture a semiconductor device in which an LDD is formed in a self-aligning manner and damage by plasma is greatly reduced.

A semiconductor device of the present invention has a gate electrode formed on a gate insulating films and is characterized in that a hard mask is placed on the gate electrode.

In a semiconductor device manufactured by the method described above, a hard mask, which is indispensable to the manufacturing method, remains on a gate electrode. The hard mask remaining on the gate electrode may be removed, but in the present invention, for the purpose of simplifying the manufacturing process, the hard mask is not removed but is used as a part of an interlayer film. Alternatively, the hard mask remaining on the gate electrode is used as a part of the gate electrode when the hard mask is formed from a conductive material.

A semiconductor device of the present invention has a gate electrode formed on a gate insulating film and a hard mask formed on the gate electrode, and is characterized in that a conductive film to serve as a wire for sending a signal to the gate electrode or as a connection layer for connecting the wire with the gate electrode is in contact with the gate electrode.

In a semiconductor device of the present invention, a semiconductor layer is doped with an impurity through a conductive film that forms a gate electrode and therefore the gate electrode film is very thinly formed. Opening a contact hole above such gate electrode is very difficult, for the gate electrode could be etched accidentally during etching for opening the contact hole, causing penetration through the gate electrode. This problem is solved by employing a TFT structure in which a conductive film to serve as a wire for sending a signal to the gate electrode or as a connection layer for connecting this wire with the gate electrode is placed in a region on the gate electrode that is not covered with a hard mask. The connection layer has to be thick enough to prevent etching for opening the contact hole from causing penetration through the gate electrode.

BRIEF DESCRIPTION OF THE DRAWINGS

FIGS. 1A to 1D are sectional views showing an LDD formation process in a related art;

FIGS. 10A to 10 C are sectional views showing a formation process of a TFT array substrate in which a logical operation circuits TFT, a driver circuit TFT and a pixel TFT of a liquid crystal display device are formed in the same substrate;

FIGS. 11A to 11 C are sectional views showing a formation process of a TFT array substrate in which a logical operation circuits TFT, a driver circuit TFT and a pixel TFT of a liquid crystal display device are formed in the same substrate;

FIGS. 12A and 12B are sectional views showing a formation process of a TFT array substrate in which a logical operation circuits TFT, a driver circuit TFT and a pixel TFT of a liquid crystal display device are formed in the same substrate;

DETAILED DESCRIPTION OF THE PREFERRED EMBODIMENTS

Figure 2A:
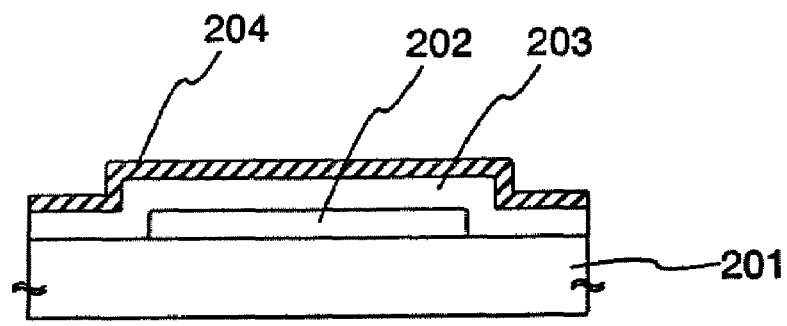
FIGS. 2A to 2D are sectional views showing an LDD formation process in the present invention.
Figure 2B:
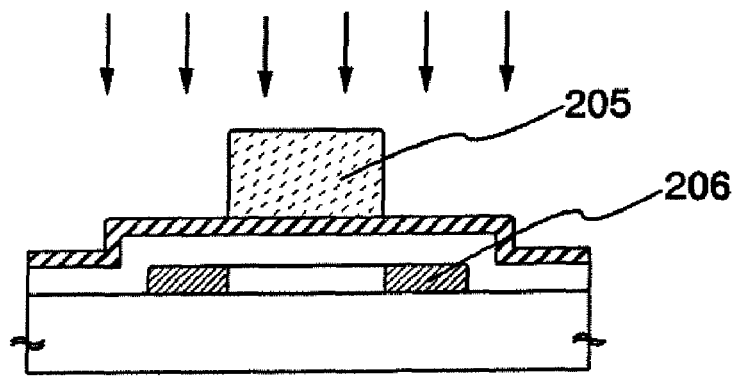
Figure 2C:
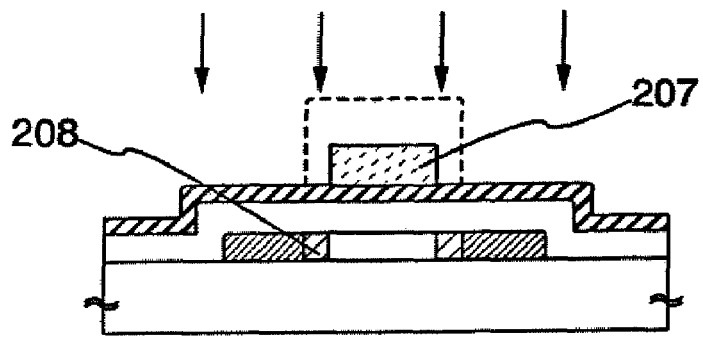
Figure 2D:
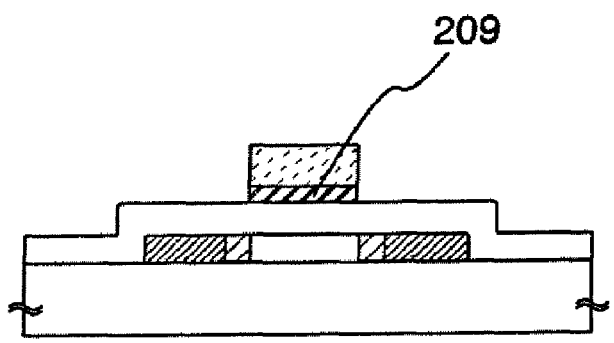
Figure 3A:
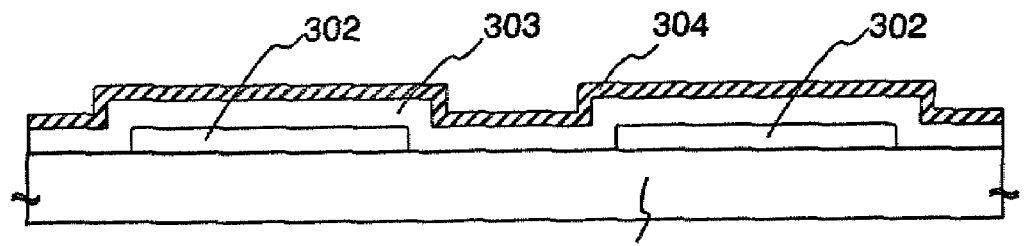
FIGS. 3A to 3E are sectional views showing a manufacturing process of an LDD structure TFT.
Figure 3B:
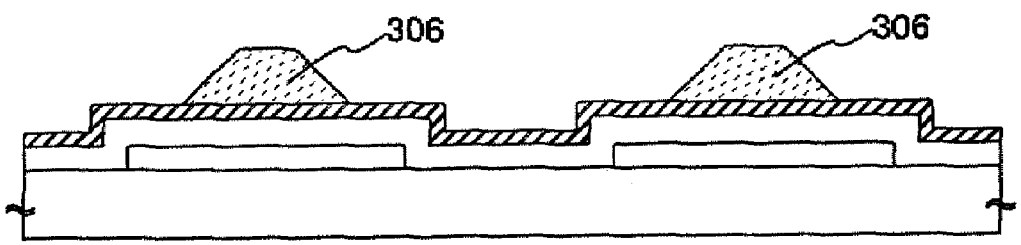
Figure 3C:
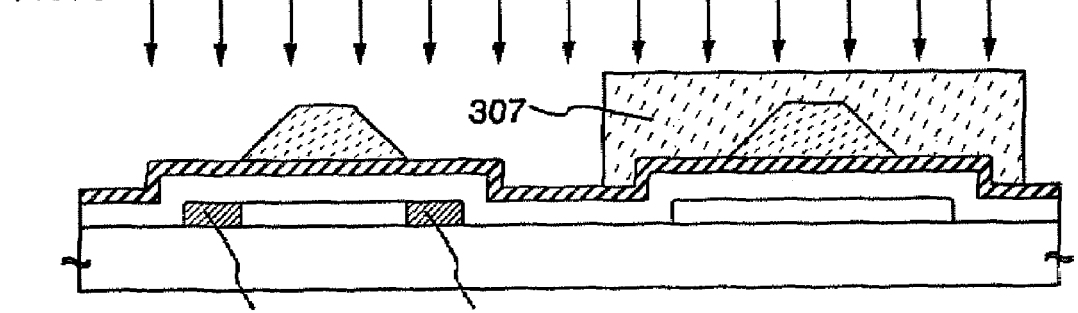
Figure 3D:
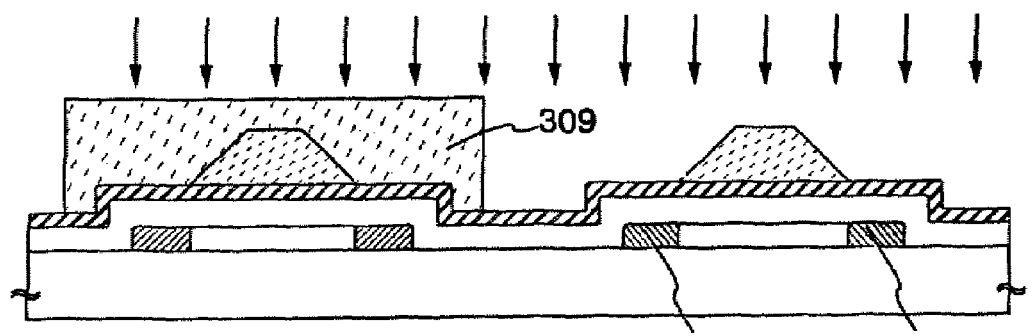
Figure 3E:
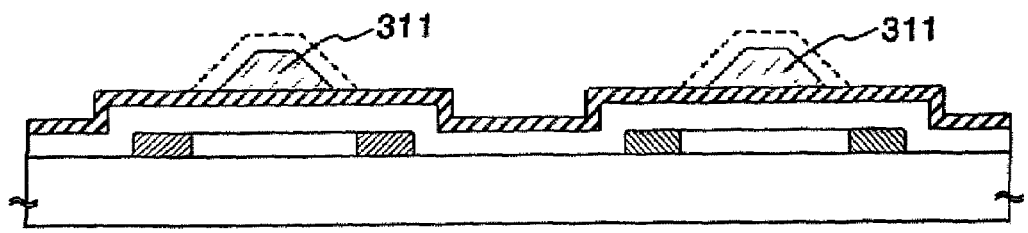
Figure 4A:
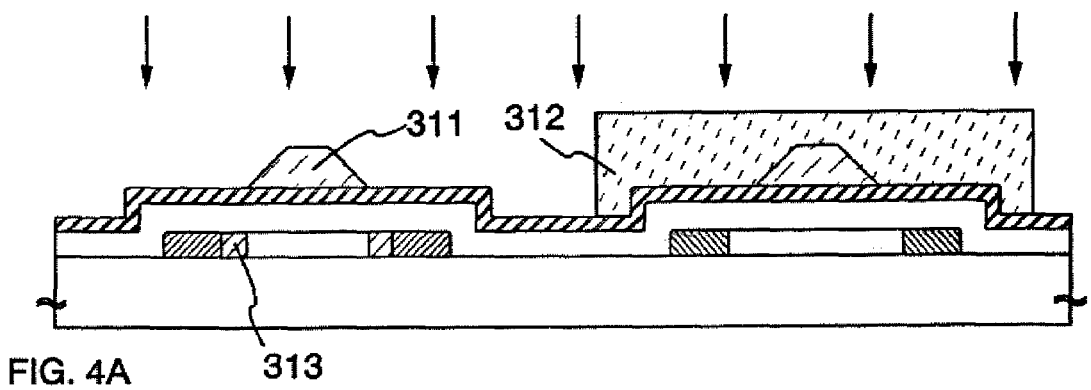
FIGS. 4A to 4D are sectional views showing a manufacturing process of an LDD structure TFT.
Figure 4B:
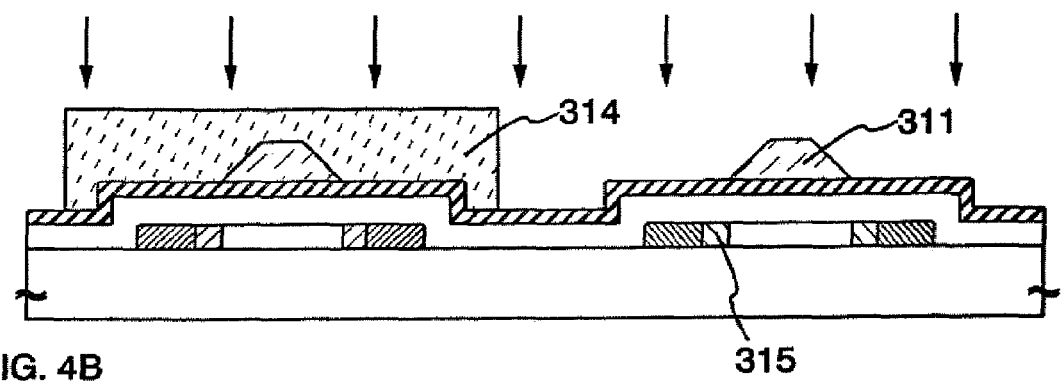
Figure 4C:
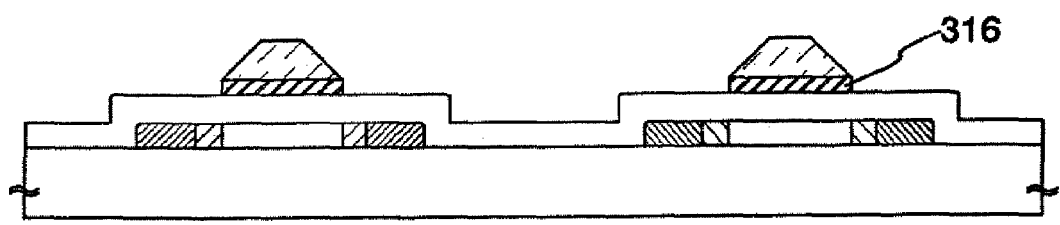
Figure 4D:
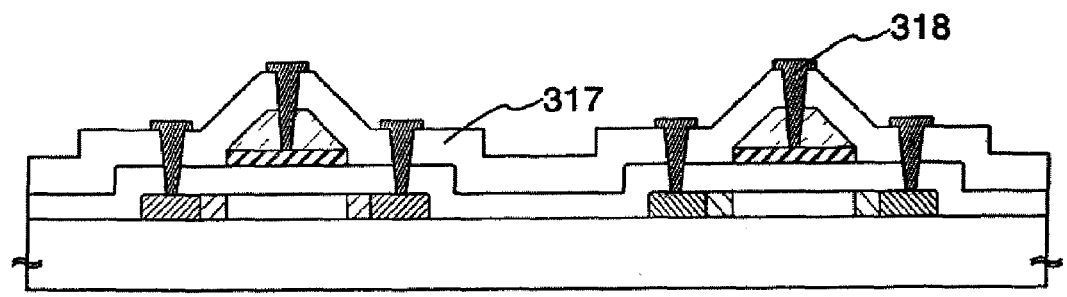

An embodiment mode of the present invention is described with reference to FIGS. 3A to 3E and FIGS. 4A to 4D. The description given here is about a method of manufacturing an LDD structure TFT in which an LDD is formed in a self-aligning manner and damage by plasma is greatly reduced.

FIGS. 3A to 3E are sectional views showing a process of manufacturing an LDD structure TFT in accordance with the present invention.

Island-like semiconductor films 302 are formed on a glass substrate 301. On the semiconductor films 302, a silicon oxide film is formed to a thickness of 20 to 60 nm to form a gate insulating film 303. Then, a tantalum nitride (TaN) film with a thickness of 20 to 60 nm is formed on the gate insulating film 303 to serve as a conductive film 304.

A silicon oxide film with a thickness of 0.6 to 1.5 μm is formed on the conductive film 304. The silicon oxide film is masked with a resist mask and processed by selective etching in a manner that gives side walls of the silicon oxide film an angle of inclination of 35 to 50°. Thus formed on the conductive film 304 are hard masks 306. Then the resist mask on the hard masks 306 is removed. A material other than silicon oxide may be used to form the hard masks as long as the material has high etching selectivity with respect to the material of the conductive film 304 and is easy to control the amount of shrinkage by etching. The thickness of the silicon oxide film as the material of the hard masks has to be equal to or larger than the sum of the amount of vertical shrinkage (in other words, how much the film is thinned) by etching and the film thickness necessary to mask the underlying layers during impurity doping for forming an LDD. Accordingly, the silicon oxide film as the hard masks can have a thickness outside of the range given in the above as required. Details of how the thickness of a hard mask is decided will be described later.

Next, a region for forming a p-channel TFT is masked with a resist mask 307 whereas one of the semiconductor films 302 that forms an n-channel TFT is masked with one of the hard masks 306. In this state, the semiconductor film is doped with phosphorus, which is an n type impurity, in a concentration of $1 \times 10^{19}$ to $1 \times 10^{21}/cm^3$ to form impurity regions 308, one of which serves as a source and the other of which serves as a drain. Although phosphorus is used here, other n type impurities such as arsenic may be employed instead. The resist mask 307 is removed after the impurity doping.

Further, a region for forming an n-channel TFT is masked with a resist mask 309 whereas one of the semiconductor films 302 that forms a p-channel TFT is masked with one of the hard masks 306. In this state, the semiconductor film is doped with boron, which is a p type impurity, in a concentration of $1 \times 10^{19}$ to $1 \times 10^{21}/cm^3$ to form impurity regions 310, one of which serves as a source and the other of which serves as a drain. At this time, p type impurities other than boron may be employed instead. The resist mask 309 is removed after the impurity doping.

Then the hard masks 306 are each shrunk by 0.4 to 1.0 μm in the horizontal direction through anisotropic etching that focuses on the vertical direction. Obtained as a result are hard masks 311. During the anisotropic etching, the conductive film 304 covers the entire substrate to present a very large surface area. This lowers the density of electric charges accumulated in the conductive film 304 in dry anisotropic etching, and therefore greatly reduces damage brought by plasma. Another way to obtain the hard masks 311 is to make the hard masks 306 shrink by isotropic etching. The amount of shrinkage of each of the hard masks 306 in the horizontal direction equals to the length of an LDD, which is formed later. The LDD length does not always have to be set to 0.4 to 1.0 μm, and can be determined at designer's discretion.

Instead of dry etching used in the above, wet etching may be employed to make the hard masks 306 shrink. If the side walls of the hard masks 306 have an angle of inclination of 50 to 90° unlike this embodiment mode, isotropic etching or anisotropic etching that focuses on the horizontal direction is preferred in order to induce shrinkage in the horizontal direction. In the case where side walls of the hard masks 306 have an angle of inclination of 35 to 50° as in this embodiment mode, or form arc shapes, the etching method employed may be isotropic etching or anisotropic etching that focuses on either the horizontal direction or the vertical direction. If the side walls of the hard masks 306 have an angle of inclination of 35° or less unlike this embodiment mode, anisotropic etching that focuses on the vertical direction is preferred.

Parameters that determine the shapes of the hard masks 306 and the hard masks 311 are: the hard mask film thickness; the angle of inclination of the side walls; and the amount of horizontal shrinkage by etching. This means that the amount of horizontal shrinkage, namely, the LDD length, varies depending on the angle of inclination of the side walls even when etching conditions to make the hard masks 306 shrink are equal. Therefore the two parameters, the angle of inclination of the side walls and the amount of horizontal shrinkage by etching, have to be adjusted such that a desired LDD length is obtained from correlation between these two parameters. In addition, the hard mask film thickness has to be adjusted such that it is below the amount of vertical shrinkage (in other words, how much the film is thinned) by etching. For instance, when the hard masks 306 are trapezoidal in section and the angle of inclination of the side walls of the hard masks 306 is given as θ, the amount of vertical shrinkage of each of the hard masks 306 as x, and the amount of horizontal shrinkage of each of the hard masks 306 as y, $y = x(\tan \theta)^{-1}$ is satisfied. If the hard masks 306 have any other shape than trapezoid, it is necessary to collect data, for each different shape, in advance, about correlation between the amount of horizontal shrinkage by etching and the amount of vertical shrinkage (in other words, how much the film is thinned) by etching.

One more thing to be taken into account when determining the hard mask thickness is that the hard masks 306 have to be thick enough to mask the underlying layers during impurity doping for forming an LDD in a later step. Accordingly, the minimum hard mask thickness is the sum of the amount of vertical shrinkage (in other words, how much the film is thinned) by etching and the film thickness necessary to mask the underlying layers during impurity doping for forming an LDD.

Next, a region for forming a p-channel TFT is masked with a resist mask 312 whereas one of the semiconductor films 302 that forms an n-channel TFT is masked with one of the hard masks 311. In this state, the semiconductor film is doped with phosphorus, which is an n type impurity, in a concentration of $1 \times 10^{16}$ to $1 \times 10^{17}/cm^3$ to form LDDs 313. Although phosphorus is used here, other n type impurities such as arsenic may be employed instead. The resist mask 312 is removed after the impurity doping.

Further, a region for forming an n-channel TFT is masked with a resist mask 314 whereas one of the semiconductor films 302 that forms a p-channel TFT is masked with one of the hard masks 311. In this state, the semiconductor film is doped with boron, which is a p type impurity, in a concentration of $1 \times 10^{16}$ to $1 \times 10^{17}/cm^3$ to form LDDs 315. At this time, p type impurities other than boron may be employed instead. The resist mask 314 is removed after the impurity doping.

Next, the conductive film 304 is processed while masked with the hard mask 311. Obtained, as a result is a gate electrode 316.

An interlayer insulating film 317 is formed above the gate electrodes 316. Then contact holes are opened and wires 318 for applying a voltage to the TFTs are formed.

Through the above steps, an n-channel TFT and p-channel TFT with an LDD structure in which an LDD is formed in a self-aligning manner and damage by plasma is greatly reduced are manufactured. A manufacturing method of a semiconductor device according to the present invention is effective particularly in manufacturing a minute TFT in which a gate electrode has a very small surface area and the channel length measures 1.5 μm or less.

EMBODIMENT

Embodiment 1

With a manufacturing method of a semiconductor device according to the present invention, an n-channel TFT and p-channel TFT with an LDD structure in which an LDD is formed in a self-aligning manner and damage by plasma is greatly reduced can be manufactured. Also, the manufacturing method of the semiconductor device according to the present invention is effective particularly in manufacturing a minute TFT. This embodiment gives a description with reference to FIGS. 5A to 5E and FIGS. 6A to 6D on a method of manufacturing a logical operation circuit, which needs minute TFTs that are fast in switching.

An insulating film such as a silicon nitride film, a silicon oxide film, or a silicon oxynitride film is formed to serve as a base insulating film 402 on a glass substrate 401. This embodiment uses as the base insulating film 402 a single layer of silicon oxide film with a thickness of 100 nm. Alternatively, the base insulating film may be a laminate of two or more layers of the above insulating films. The glass substrate may be replaced by a quartz substrate, or a silicon substrate on which an insulating film is formed, or a plastic substrate that can withstand the processing temperature of this embodiment. The base insulating film 402 is provided in order to prevent diffusion of impurities from the glass substrate 401, and therefore may be omitted if there is no fear of impurity diffusion from the substrate.

Next, a semiconductor film with a thickness of 30 to 60 nm is formed on the base insulating film 402. The semiconductor film may be an amorphous semiconductor film, a polycrystalline semiconductor film, or a microcrystalline semiconductor film. An amorphous semiconductor film material that can be employed is silicon, a silicon germanium (SiGe) alloy, or the like. This embodiment uses a polycrystalline semiconductor film obtained by forming an amorphous silicon film to a thickness of 55 nm and then crystallizing the amorphous film with the help of a catalytic metal element.

The amorphous silicon film, which is denoted by 403 but not shown in the drawings, is doped with nickel (Ni) serving as a catalytic metal element. Then the amorphous silicon film 403 is subjected to heat treatment (at 550° C. for four hours) to obtain a crystalline silicon film 404 (not shown in the drawings). The crystalline silicon film 404 is irradiated with pulse laser light in an atmosphere containing oxygen for re-crystallization, thereby improving the crystallinity of the film. The re-crystallization process may employ continuous wave laser light instead of pulse laser light. In this embodiment, XeCl excimer laser light is employed for re-crystallization in an atmosphere containing oxygen. Surface irregularities on the crystalline silicon film caused by the re-crystallization are leveled by irradiating the film again with XeCl excimer laser light (or continuous wave laser light) in a nitrogen atmosphere. Thus obtained is a crystalline silicon film 405 (not shown in the drawings). Leveling the surface irregularities of the crystalline silicon film is an effective measure to for a minute TFT whose characteristics are greatly affected by film surface irregularities.

After the crystallization, Ni is no longer needed and removed from the crystalline silicon film 405. The surface of the crystalline silicon film 405 is treated with ozone water to form an oxide film as thin as 1.5 nm. On the thin oxide film, a silicon film 406 (not shown in the drawings) containing argon (Ar) is formed by sputtering and subjected to heat treatment (at 550° C. for four hours). Through the heat treatment, Ni contained in the crystalline silicon film 405 moves to the silicon film 406 and a crystalline silicon film 407 (not shown in the drawings) containing no Ni is obtained. This embodiment uses the thus obtained crystalline silicon film 407 as the semiconductor film.

The crystalline silicon film 407 is doped with a p type impurity in order to control the threshold of the TFTs. In this embodiment, the p type impurity used for the doping is boron. An n type impurity may be employed instead if necessary. The impurity doping for controlling the threshold may be performed in advance on the amorphous silicon film, or after the semiconductor film is shaped into a desired shape.

The crystalline silicon film 407 is processed by patterning to obtain island-like semiconductor films 408.

A silicon oxide film with a thickness of 50 nm is formed as a gate insulating film 409 covering the semiconductor films 408. The gate insulating film is a silicon oxide film, a silicon nitride film, or like other insulating film. The thickness of the gate insulating film has to be determined appropriately taking into consideration the dielectric constant of its materials and other factors.

On the gate insulating film 409, a tantalum nitride (TaN) film with a thickness of 30 nm is formed to serve as a conductive film 410. A preferable material for the conductive film 410 (not shown in the drawings) is tungsten (W) or others that exhibit high etching selectivity with respect to a hard mask to be formed later.

Here, attention has to be paid to the thicknesses of the gate insulating film 409 and the conductive film 410. As described below, the semiconductor films 408 are doped with an impurity through the gate insulating film 409 and the conductive film 410 in this embodiment. For that reason, the sum of the thickness of the gate insulating film 409 and the thickness of the conductive film 410 has to be small enough to be pierced by an impurity and, at the same time, the gate insulating film 409 has to be thick enough to provide desired TFT characteristics.

Next, hard masks are formed on the conductive film 410. A silicon oxide film with a thickness of 1 μm is formed on the conductive film 410 and is processed by patterning to form hard masks 411. The hard masks 411 are each shaped like an island on the conductive film 410 and have side walls inclined at an angle of 45°. In the present invention, how much a hard mask is shrunk by etching equals to the LDD length as described below. A shrunk hard mask is used to mask the underlying layers during impurity doping and is also used to mask the underlying layers in forming a gate electrode. Therefore, the thickness of the hard masks 411 has to be equal to or larger than the sum of a desired LDD measurement and a film thickness necessary to mask the underlying layers in impurity doping. More specifically, the length of the base of the trapezoid, which is the sectional shape in the channel length direction of the hard masks 411 with the inclined side walls, has to be the sum of the channel length and the doubled LDD length.

Then a region for forming the p-channel TFT is masked with a resist mask 412. Masked with one of the hard masks 411, one of the semiconductor films 408 that forms the n-channel TFTs doped with phosphorus, which is an n type impurity, through the conductive film 410 and the gate insulating film 409. The phosphorus concentration is set to $1 \times 10^{20}/cm^3$. Thus obtained are impurity regions 413, one of which serves as a source and the other of which serves as a drain. Although the n type impurity used in the doping is phosphorus in this embodiment, n type impurity of other type may be employed instead. The resist mask 412 is removed after the impurity doping.

Further, a region for forming the n-channel TFT is masked with a resist mask 414. Masked with one of the hard masks 411, one of the semiconductor films 408 that forms the n-channel TFT is doped with boron, which is a p type impurity, through the conductive film 410 and the gate insulating film 409. The boron concentration is set to $1 \times 10^{20}/cm^3$. Thus obtained are impurity regions 415, one of which serves as a source and the other of which serves as a drain. Although the p type impurity used in the doping is boron in this embodiment, p type impurity of other type may be employed instead. The resist mask 414 is removed after the impurity doping.

Next, the hard masks 411 are etched using trifluoromethane ($CHF_3$) gas in order to make the hard masks 411 shrink and create hard masks 416. The hard masks 411 in this embodiment are shrunk by dry anisotropic etching that focuses on the vertical direction, so that side walls of the hard masks 416 are inclined at an angle of 45°. In this embodiment, the amount of shrinkage is set to 0.5 μm in order to obtain an LDD length of 0.5 μm.

The region for forming the p-channel TFT is then masked with resist mask 417. Masked with one of the hard masks 416, one of the semiconductor films 408 that forms the n-channel TFT is doped with phosphorus, which is an n type impurity, through the conductive film 410 and the gate insulating film 409. The phosphorus concentration is set to $1 \times 10^{17}/cm^3$. Thus obtained are LDDs 418. The n type impurity concentration in the doping for forming the LDDs 418 is very low compared to the n type impurity concentration needed in the previous doping for forming the source and drain regions 413. Doping the source and drain regions 413 again with the n type impurity therefore does not cause any problem, and merely turns regions that have not been doped with the impurity used to form the source and drain regions 413 into the LDDs 418. Although the n type impurity used in the doping is phosphorus in this embodiment, other n type impurity may be employed instead. The resist mask 417 is removed after the impurity doping.

The region for forming the n-channel TFT is then masked with a resist mask 419. Masked with one of the hard masks 416, one of the semiconductor films 408 that forms the n-channel TFT is doped with boron, which is a p type impurity, through the conductive film 410 and the gate insulating film 409. The boron concentration is set to $1 \times 10^{17}/cm^3$. Thus obtained are LDDs 420. The p type impurity concentration in the doping for forming the LDDs 420 is very low compared to the p type impurity concentration needed in the previous doping for forming the source and drain regions 415. Doping the source and drain regions 415 again with the p type impurity therefore does not cause any problem, and merely turns regions that have not been doped with the impurity used to form the source and drain regions 415 into the LDDs 420. Although the p type impurity used in the doping is boron in this embodiment, other p type impurity may be employed instead. The resist mask 419 is removed after the impurity doping.

Masked with the hard masks 416, the conductive film 410 is selectively etched with a mixture of sulfur hexafluoride ($SF_6$) gas and chlorine ($Cl_2$) gas to form gate electrodes 421. Accordingly, the measurement of the hard masks 416 defines the measurement of the gate electrodes, which in turn determines the channel length of the TFTs. In this embodiment, the shape of the hard masks 416 sets the channel length to 1 μm. This is because, in this embodiment, the hard masks 411 are patterned in advance such that the hard masks 416 each measure 1 μm laterally in section in the channel length direction while taking into account the amount of horizontal shrinkage of the hard masks 411.

An n-channel TFT and a p-channel TFT which have an LDD structure are formed in the manner described above. There is no difference whether the impurity doping for the n-channel TFT is conducted first or the impurity doping for the p-channel TFT is conducted first.

In this embodiment, after the gate electrodes 421 are formed, the hard masks 416 are not removed and used as a part of an interlayer insulating film. The thickness of the hard masks 416 after the gate electrodes 421 are formed is preferably almost equal to the thickness of the gate insulating film 409, so that contact holes in the source and drain portions and contact holes in the gate electrode portions can be opened simultaneously in a later step.

An interlayer insulating film is formed above the gate electrodes 421. The interlayer insulating film is a single layer or a laminate of insulating films such as a silicon oxide film and a silicon nitride film. The substrate surface may be leveled using glass coating or the like. In this embodiment, a silicon nitride film with a thickness of 100 nm is formed as an interlayer insulating film 422.

The impurities used in the doping are activated by heat treatment. The heat treatment may take place before or after the interlayer insulating film is formed. In the case where the interlayer insulating film is a laminate, the heat treatment may be placed between formation of one layer of the interlayer insulating film and formation of another layer of the interlayer insulating film. In this embodiment, the impurities are activated by heat treatment placed after formation of the gate electrodes 421, and a nitrogen atmosphere is chosen for the heat treatment so as not to oxidize the gate electrodes. The heat treatment lasts for four hours with the temperature set to 550° C. The heat treatment is followed by hydrogenation treatment at 410° C. for an hour. The hydrogenation treatment may be conducted after wiring formation which is performed later provided that the hydrogenation treatment temperature does not exceed a temperature that the wire material can withstand.

Then the contact holes are opened to form wires 423 to be electrically connected to the gate electrodes and to the source and drain regions. The wires 423 in this embodiment are obtained by forming a laminate and giving the laminate a desired shape by photolithography and etching. The laminate includes a Ti film with a thickness of 60 nm, a TiN film with a thickness of 40 nm, an Al—Si (Al containing 2 wt % of Si) film with a thickness of 350 nm, and a Ti film stacked thereon.

In the present embodiment, another interlayer insulating film, which is denoted by 424, is formed on the wires 423 and contact holes are opened in the interlayer insulating film 424 to form wires 425. This makes it possible to use different layers in leading out a wiring group that are connected to the gate electrodes and a wiring group that are connected to the source and drain regions, thereby increasing the degree of freedom in leading out wires. Formation of an interlayer insulating film and formation of wires may be repeated further to form multi-layer wires.

A logical operation circuit is manufactured through the above steps.

Embodiment 2

Figure 7A:
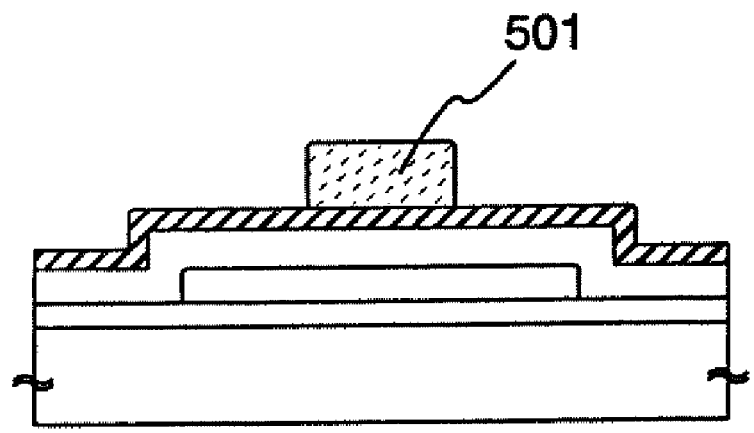
FIGS. 7A to 7C are sectional views showing a manufacturing process of a hard mask.
Figure 7B:
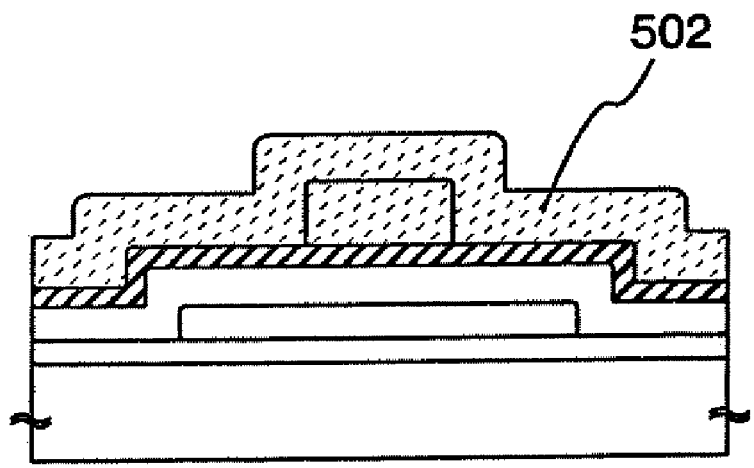
Figure 7C:
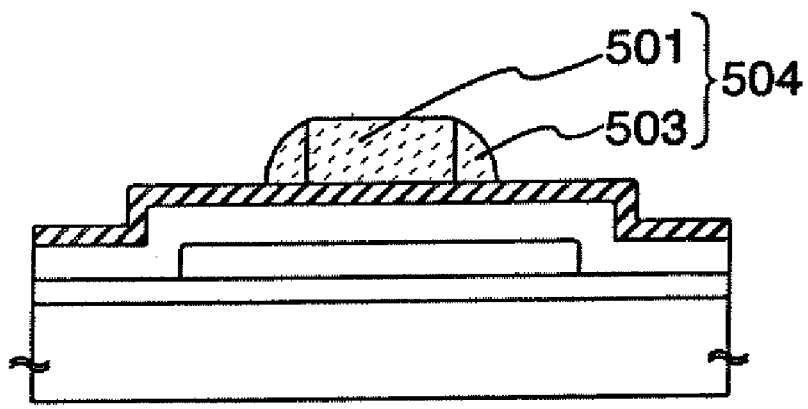

Instead of using a hard mask having side walls inclined at an angle of 45° as in Embodiment 1, a hard mask with side Walls forming arc shapes may be used. This increases the number of manufacturing steps from that of Embodiment 1, but is effective when it is difficult to shape a hard mask as in Embodiment 1. Isotropic etching, or anisotropic etching that focuses on the vertical direction or the horizontal direction can be employed to make the hard mask shrink. This embodiment gives a description with reference to FIGS. 7A to 7C a method of manufacturing a logical operation circuit using a hard mask that has arc-shaped side walls.

The circuit manufacturing method of this embodiment is identical with the one in Embodiment 1 except how a hard mask is formed. The description given here therefore centers on a method of forming a hard mask. For the rest of the manufacturing steps, see Embodiment 1.

Following the method of Embodiment 1, films are layered on a substrate, the top layer being the conductive film. On the thus prepared substrate, a silicon oxide film with a thickness of 1 μm is formed and processed by patterning to obtain a hard mask 501. At this point, side walls of the hard mask 501 are approximately perpendicular to the substrate plane.

Next, a silicon oxide film 502 capable of isotropic step coverage well is formed to a thickness of 500 nm to cover the hard mask 501. The silicon oxide film 502 is processed by anisotropic etching that focuses on the vertical direction until the silicon oxide film 502 is etched away by about 500 nm.

This gives the hard mask 501 arc-shaped side walls, which are referred to as side walls 503. The hard mask 501 and the side walls 503 together make a hard mask 504. The thus formed hard mask 504 corresponds to each of the hard masks 411 in Embodiment 1.

The density of electric charges accumulated in the conductive film during the anisotropic etching for forming the side walls 503 is low because the conductive film covers the entire substrate to present a very large surface area. Damage by plasma is therefore greatly reduced and this is one of characteristics of this embodiment.

The steps subsequent to formation of the hard mask 504 are identical to the steps subsequent to formation of the hard masks 411 in Embodiment 1, and the descriptions thereof are omitted here.

A logical operation circuit is manufactured through the above steps.

Embodiment 3

Figure 8A:
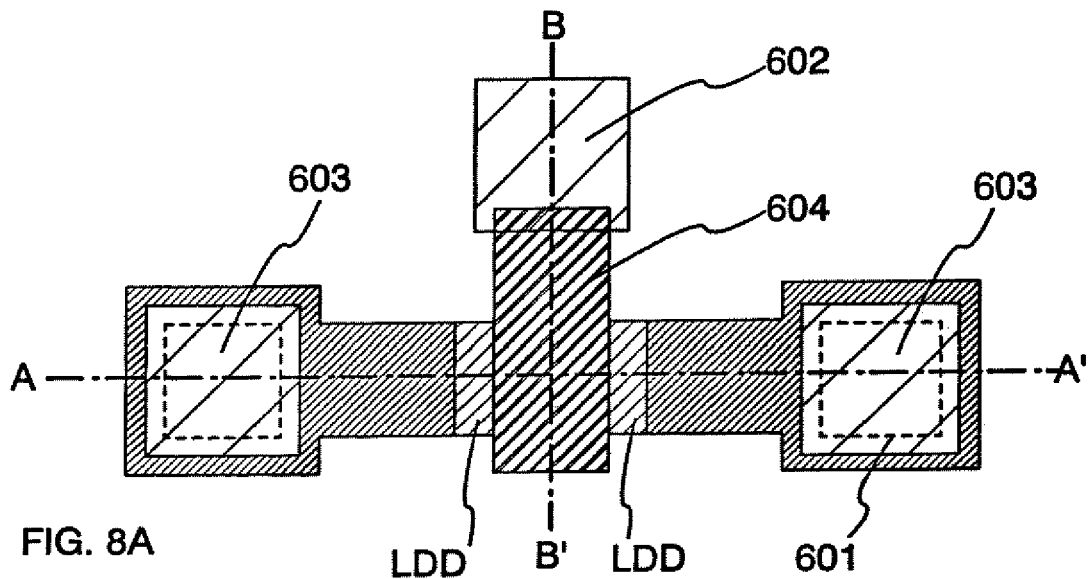
FIGS. 8A to 8C are sectional views showing a formation process of contact portion connection layers.
Figure 8B:
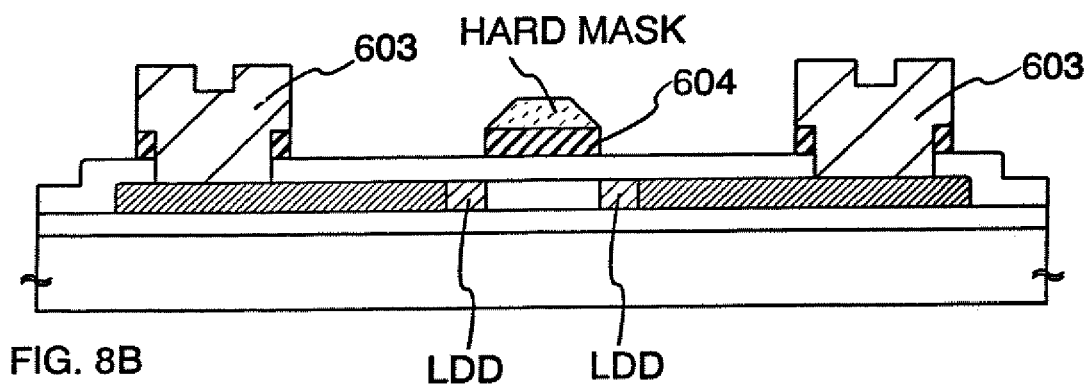
Figure 8C:
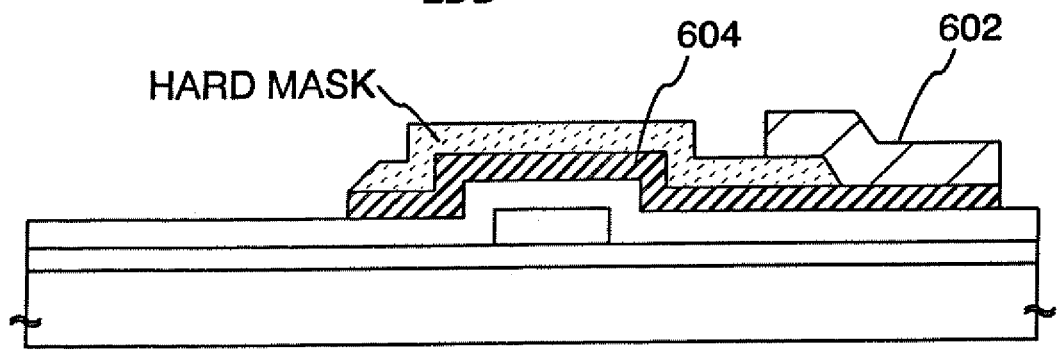
Figures 9A, 9B, 9C:
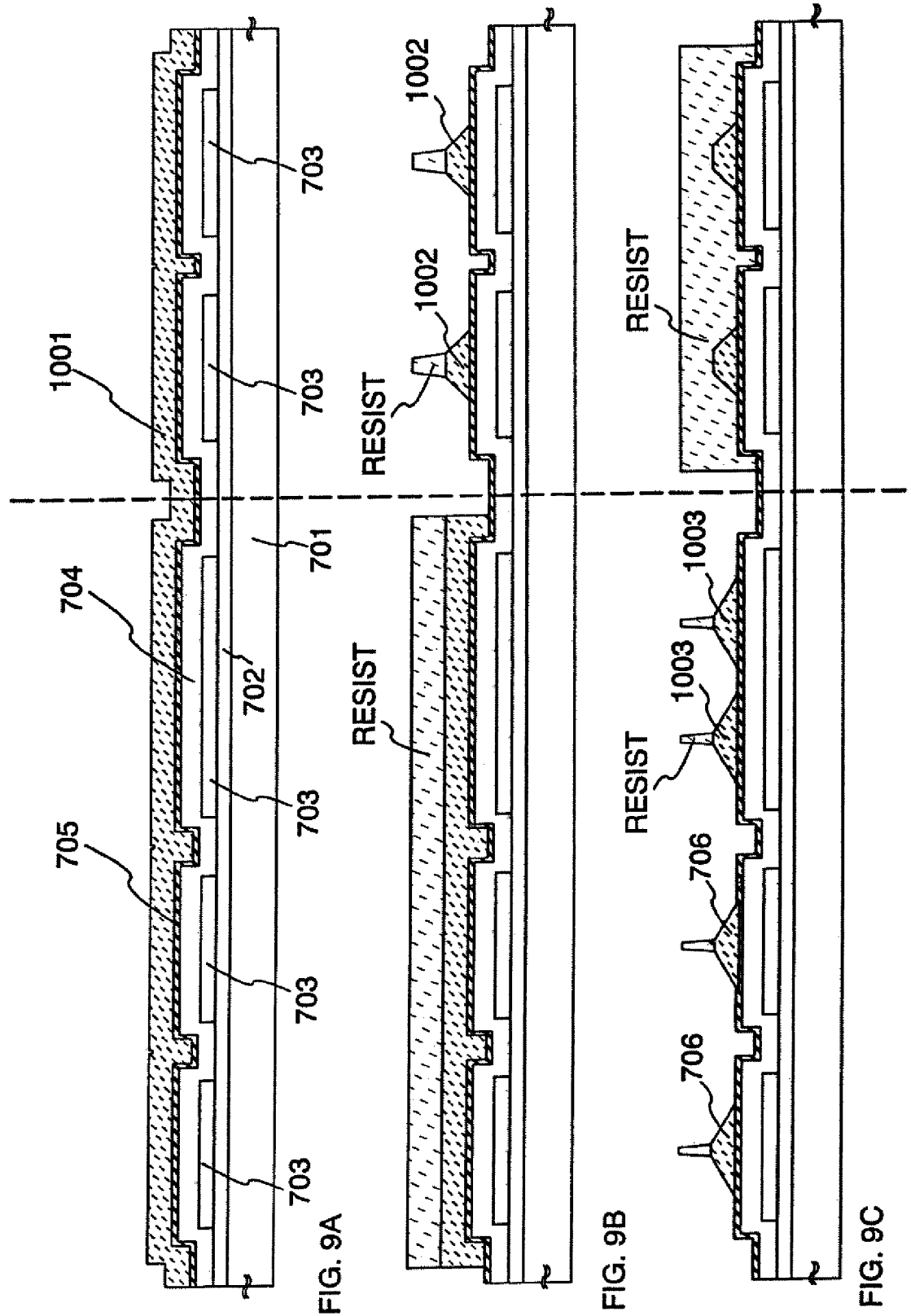
FIGS. 9A to 9C are sectional views showing a formation process of a TFT array substrate in which a logical operation circuits TFT, a driver circuit TFT and a pixel TFT of a liquid crystal display device are formed in the same substrate.

Referring to FIGS. 8A to 8C, this embodiment describes a manufacturing method of a semiconductor device according to the present invention using a method in which a wire is connected to a gate electrode without forming a contact hole in a hard mask on the gate electrode. This method makes it possible to avoid a gate electrode from being accidentally etched in opening a contact hole in an interlayer insulating film of the gate electrode.

Figure 5A:
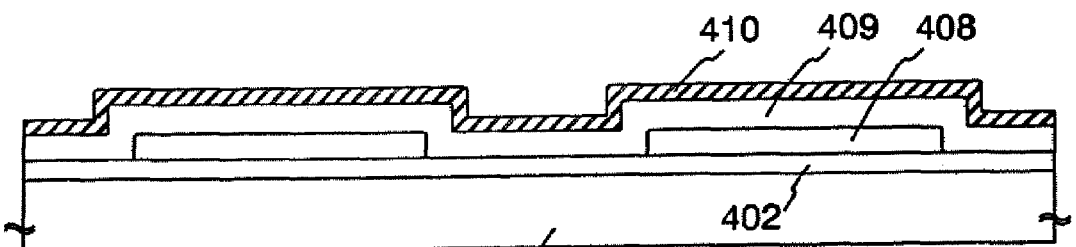
FIGS. 5A to 5E are sectional views showing a manufacturing process of logical operation circuits.
Figure 5B:
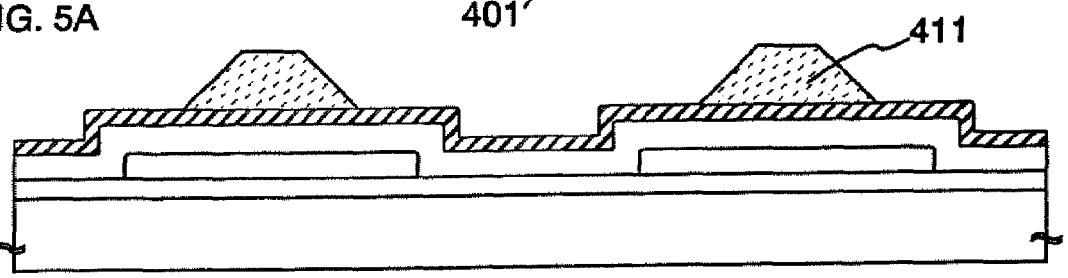
Figure 5C:
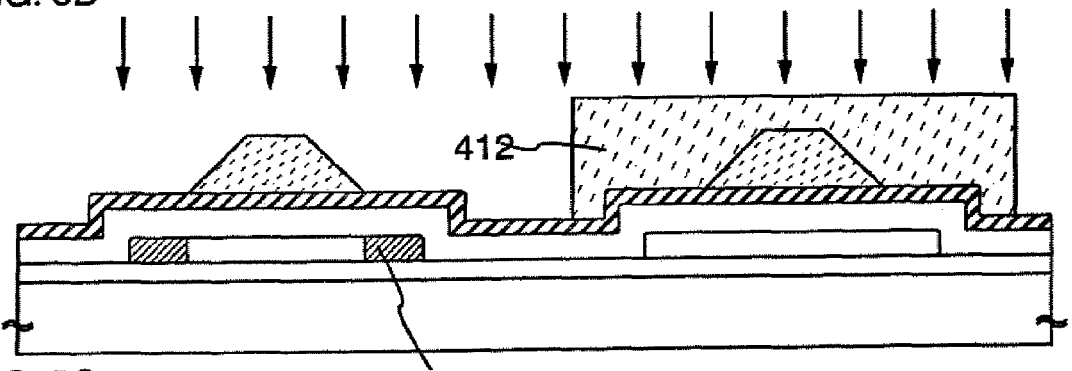
Figure 5D:
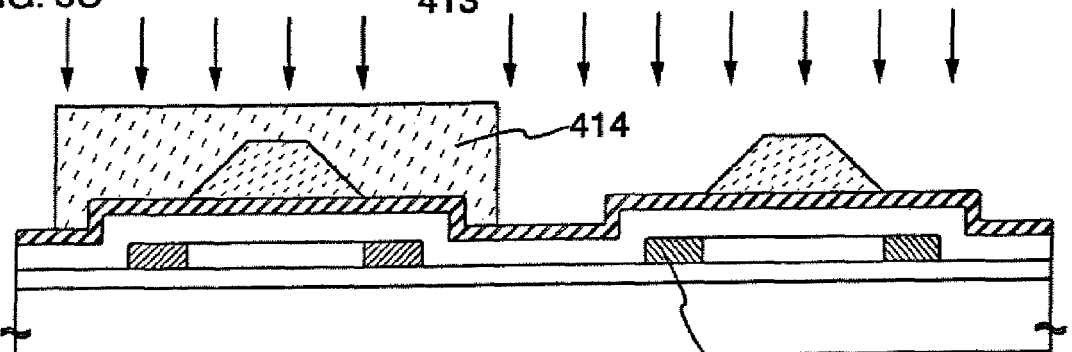
Figure 5E:
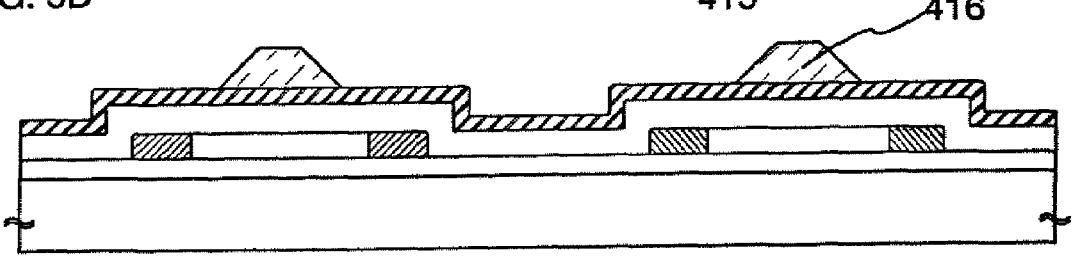
Figure 6A:
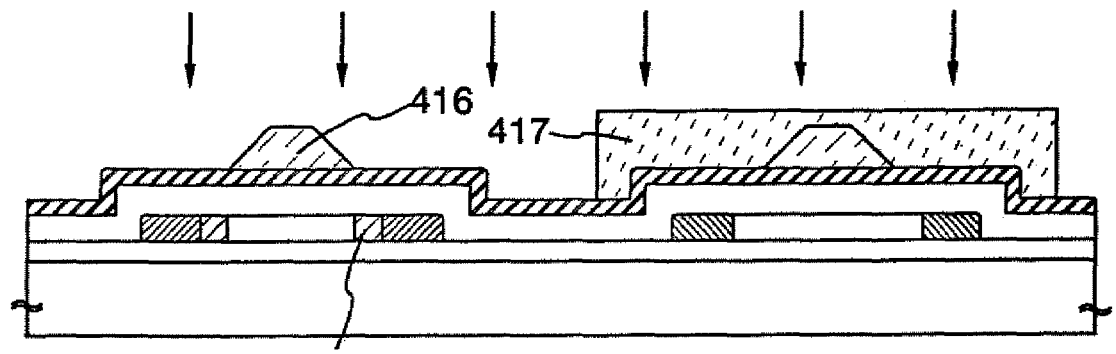
FIGS. 6A to 6D are sectional views showing a manufacturing process of an logical operation circuits.
Figure 6B:
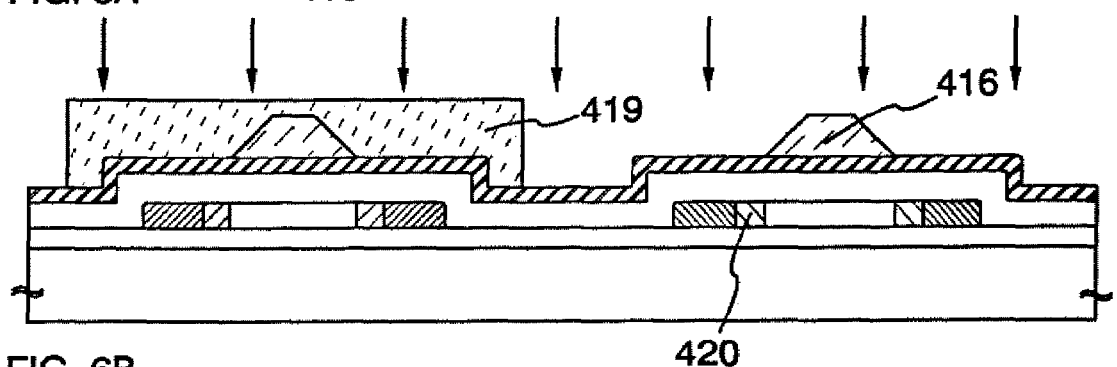
Figure 6C:
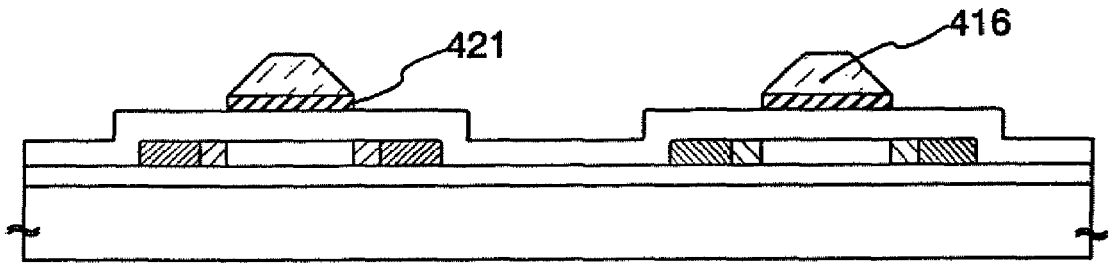
Figure 6D:
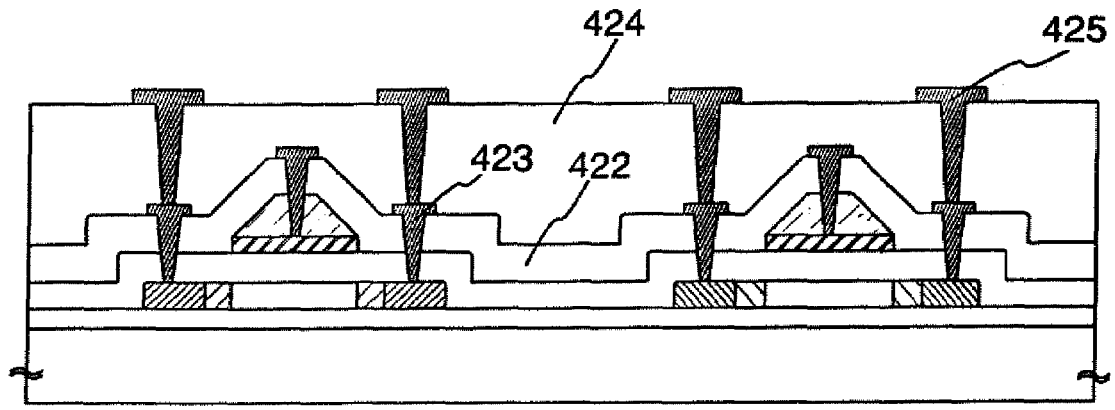

FIG. 8A is a top view of one of TFTs, FIG. 8B is a sectional view in the channel length direction (A-A'), and FIG. 5C is a sectional view in the channel width direction (B-B').

In this embodiment, steps up through formation of the LDDs 420 of the p-channel TOT and subsequent removal of the resist mask 419 are identical with those of Embodiment 1. Accordingly, details of those steps are omitted from the description.

After the LDDs of the n-channel TFT and the p-channel TFT are formed, contact holes 601 which pierce a gate electrode 604 and a gate insulating film 607 are formed in the source and drain portions by patterning and etching.

Next, a tungsten (W) film with a thickness of 100 nm is formed covering the substrate surface. The W film is patterned and processed by selective etching. Formed as a result are a W connection layer 602 for connecting the gate electrode to a wire and W connection layers 603 for connecting the source and the drain to wires.

Masked with the hard mask and the W connection layers 602 and 603, the TaN film is selectively etched to form the gate electrode 604.

After forming the gate electrode 604, an interlayer insulating film (not shown in the drawings) is formed. Contact holes for connecting the connection layers 602 and 603 to wires (not shown in the drawings) are opened in the interlayer insulating film. Then the wires (not shown) are formed. Activation and hydrogenation are performed as needed.

By using this methods a semiconductor device can be manufactured while avoiding a difficult process such as opening a contact hole above a thin gate electrode.

Another advantage of the above-described method is that the determining the hard mask thickness does not require the consideration described in Embodiment 1, where the hard masks 416 and the gate insulating film 409 have to have the same thickness in order to simultaneously open contact holes in the source and drain portions and contact holes in the gate electrode portions.

After the connection layers 602 and 603 are formed, RTA (Rapid Thermal Annealing) is used to locally heat contact areas where the connection layers 602 and 603 are in contact with the semiconductor film and a contact area between the gate electrode 604 and the gate insulating film. This is effective in activating the impurities and repairing defects in the gate insulating film. An RTA apparatus with a tungsten halogen lamp as a light source is employed in this embodiment. Another preferred heating apparatus is one with a light source that emits light of infrared region, which is absorbed by a metal at a high absorption coefficient.

The connection layers 602 and 603 in this embodiment are formed from a tungsten film with a thickness of 100 nm but a tungsten film with a thickness of 500 nm or more may be used instead to form the connection layers 602 and 603 and as wires.

Embodiment 4

This embodiment gives a description with reference to FIGS. 9A to 12B on a method of manufacturing, on the same substrate, a logical operation circuit built from LDD structure TFTs that are obtained by a manufacturing method of a semiconductor device according to the present invention and pixel TFTs and driver circuit TFTs which are necessary to construct a liquid crystal display device or a similar device. According to this method, system-on-panel or the like in which peripheral circuits with a built-in CPU (Central Processing Unit) and a display are integrated on one substrate can be manufactured.

In this embodiment, logical operation circuit TFTs, pixel TFTs, and driver circuit TFTs are formed on the same substrate. The logical operation circuit TFTs are LDD structure TFTs for a logical operation circuit, and each of the logical operation circuit TFTs has a channel length of 1 μm and an LDD length of 0.5 μm. The pixel TFTs are LDD structure TFTs for driving pixels of a liquid crystal display device, and each of the pixel TFTs has a channel length of 4.5 μm and an L-D length of 2 μm. The driver circuit TFTs are TFTs for driver circuits of the liquid crystal display device, and each of the driver circuit TFTs has a channel length of 8 μm and a gate overlapped LDD length of 2 μm.

In this embodiment, TFTs having different LDD lengths are formed on the same substrate. Therefore, different hard masks are prepared to suit TFTs of varying LDD length. First, following the method described in Embodiment 1, a base insulating film 702, semiconductor films 703 having a desired shape, a gate insulating film 704, and a conductive film 705 are formed on a substrate 701. On the conductive film 705, a silicon nitride film 1001 is formed to a thickness of 1 μm to form a hard mask. The thickness of the silicon nitride film 1001 is determined in accordance with a hard mask that shrinks more than any other hard masks by etching.

A silicon nitride film 1002 for forming a logical operation circuit TFT is formed next. The silicon nitride film 1002 is patterned and selectively etched to form the hard masks 1002. The hard masks 1002 each have side walls inclined at an angle of 45° and are shaped, in section in the channel direction, like a trapezoid with the base measuring 2 μm. At this point, a region for forming a driver circuit TFT and a pixel TFT are masked with a resist mask, and a hard mask for forming a driver circuit TFT and a pixel TFT are formed in the next step.

Next, hard masks 706 for forming driver circuit TFTs and hard masks 1003 for forming pixel TFTs are formed from a silicon nitride film. The silicon nitride film is patterned and selectively etched to form the hard masks 706 and the hard masks 1003 at the same time. The hard masks 706 each have side walls inclined at an angle of 45° and are shaped, in section in the channel direction, like a trapezoid with the base measuring 12 μm. The hard masks 1003 each have side walls inclined at an angle of 45° and are shaped, in section in the channel direction, like a trapezoid with the base measuring 12 μm. At this point, regions for forming a logical operation circuit TFT is masked with resist masks.

The hard masks 706 and the hard masks 1003 have the same shape here but may be shaped differently if necessary. The hard masks 706 and 1003 here are given the same shape to simplify the manufacturing process. The order of forming the hard masks may be changed.

Regions for forming p-channel TFTs in the driver circuit TFTs and the logical operation circuit TFTs are masked with resist masks. Further masked with the hard masks 706, 1002, and 1003 the semiconductor films are doped with phosphorus in a concentration of $1 \times 10^{20}/cm^3$ through the gate insulating film 704 and the conductive film 705. Thus formed are source and drain regions 707 of n-channel TFTs in the driver circuit TFTs, the logical operation circuit TFTs, and the pixel TFTs. Although phosphorus is used here, other n type impurities may be employed instead.

Regions for forming n-channel TFT-s in the regions of the driver circuit TFTs, pixel TFTs, and the logical operation circuit TFTs are masked with resist masks. Further masked with the hard masks 706 and 1002, the semiconductor films are doped with boron in a concentration of $1 \times 10^{20}/cm^3$ through the gate insulating film 704 and the conductive film 705. Thus formed are source and drain regions 709 of p-channel TFTs in the driver circuit TFTs and the logical operation circuit TFTs. Although boron is used here, other p type impurities may be employed instead.

Then the hard mask 1002 is selectively etched by anisotropic etching that focuses on the vertical direction, making the hard mask 1002 shrink by 0.5 μM in the vertical direction. Thus obtained is a hard mask 711. The anisotropic etching makes the hard mask 1002 shrink by 0.5 μm in the horizontal direction. Therefore, TFTs in which LDDs are formed using the hard mask 1002 are given an LDD length of 0.5 μm. During the anisotropic etching, the driver circuit TFTs and the pixel TFTs are masked with resist masks.

Then the hard masks 706 and the hard masks 1003 are selectively etched by anisotropic etching that focuses on the vertical direction, making each of the hard masks 706 and 1003 shrink by 0.85 μm in the vertical direction. Thus obtained are hard masks 1105 and 1004. The anisotropic etching makes each of the hard masks 706 and 1003 shrink by 1.5 μm in the horizontal direction. Therefore, TFT in which LDDs are formed using the hard masks 706 and 1003 are given an LDD length of 1.5 μm. During the anisotropic etching, the driver circuit TFTs and the logical operation circuit TFTs are masked with resist masks.

As described above, TFTs with varying LDD lengths can be manufactured by tactfully changing the angle of inclination of side walls of hard masks and the amount of shrinkage of hard masks through etching. If necessary, the LDD length may be adjusted by shrinkage through etching after the hard masks 1002, the hard masks 706, and the hard masks 1003 are given different thicknesses.

Regions for forming p-channel TFTs in the driver circuit TFTs and the logical operation circuit TFTs are masked with resist masks. Further masked with the hard masks 1105, 1004, and 711, the semiconductor films are doped with phosphorus in a concentration of $1 \times 10^{17}/cm^3$ through the gate insulating film 704 and the conductive film 705. Thus formed are LDDs 1005 in the logical operation circuit TFTs, the driving TFTs, and the pixel Mrs. Although phosphorus is used here, other n type impurities may be employed instead.

Regions for forming n-channel TFTs in the driver circuit TFTs, pixel TFTs, and the logical operation circuit TFT are masked with resist masks. Further masked with the hard masks 1105, 1004 and 711, the semiconductor films are doped with boron in a concentration of $1\times10^{17}/cm^3$ through the gate insulating film 704 and the conductive film 705. Thus formed are LDDs 1006 of p-channel TFTs in the logical operation circuit TFTs, and the pixel TFTs. Although boron is used here, other p type impurities may be employed instead.

Using the method described in Embodiment 3, tungsten connection layers 953 are formed. First, contact holes are formed in the source and drain regions 707 and 709 by patterning and etching. Then a tungsten film is formed to a thickness of 100 nm, patterned, and selectively etched to obtain the tungsten connection layers 953.

The connection layers 953 are also formed on regions of the conductive film 705 that overlap the LDDs 1005 and 1006 of the driver circuit TFTs. The connection layers 953 thus formed may cover all the hard masks 1105 of the driver circuit TFTs.

Next masked with the hard masks 706, 711, and 1004 and the connection layers 953, the conductive film 705 is selectively etched to form gate electrodes 720.

The connection layers 953 on the gate electrodes 720 of the driver circuit TFTs also function as a part of the gate electrodes of the driver circuit TFTs. The LDDs 1005 and 1006 of the driving TFTs overlap the gate electrodes 720 and make gate overlapped LDDs 1007 and 1008, respectively.

As described above, the driver circuit TFTs obtain gate overlapped LDDs by patterning using resist masks. This is premised on applying a voltage of about 16 V to the driver circuit TFTs of the present invention and, in this case, a gate overlapped LDD length of 1.5 to 2 μm is necessary for ensured reliability concerning hot carriers. When the gate overlapped LDD length is set to 1.5 to 2 μm, influence of the alignment precision in, patterning is substantially ignorable since it is on a far larger scale than the alignment precision (generally, ±0.2 μm in a stepper and ±0.5 μm in a mirror projection aligner).

Following this are formation of an interlayer insulating film 727, activation of the impurities, hydrogenation, and opening of contact holes. The interlayer insulating film 727 in this embodiment is a laminate of a silicon nitride film 727a and a silicon oxide film 727b formed thereon through application. Application is chosen here in order to even out surface irregularities of the substrate.

Wires 728 are formed next. Then a pixel electrode 729 is formed from a transparent conductive film such as an ITO (indium tin oxide) film. Wires to be connected to the gate electrodes are not shown in the drawing here.

In this embodiment, the pixel electrode 729 and one of the wires 728 are layered in a region so that the pixel electrode 729 can have an electric connection directly with one of the wires 728, instead of opening a contact hole.

Through the above steps, a TFT array substrate where logical circuit TFTs, pixel TFTs, and driver circuit TFTs are formed on the same substrate is manufactured. Though not mentioned in this embodiment, a washing step and a heat treatment step are added if necessary. A multi-layer wire may be formed by repeating formation of an interlayer insulating film and formation of a wire after the interlayer insulating film 727 and the wires 728 are formed in this embodiment.

Embodiment 5

Figure 13:
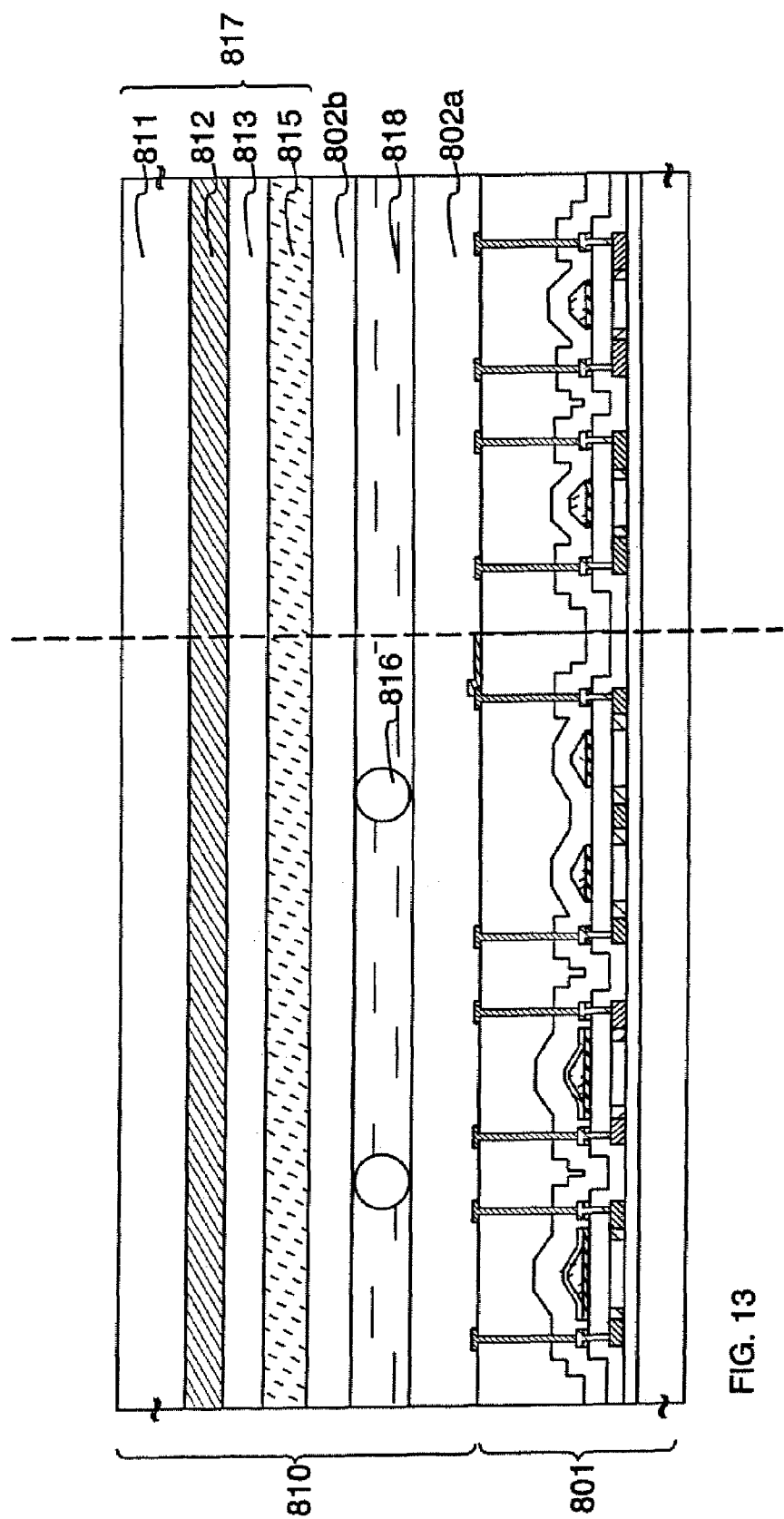
FIG. 13 is a sectional view showing a part of a liquid crystal display device.

By using a TFT array substrate made by the method shown in Embodiment 4, it is possible to manufacture a liquid crystal display in which a peripheral circuit having a CPU (Central Processing Unit) and a display are built in one substrate. Therefore, a liquid crystal display having multifunction is downsized. Hereinafter, a description is made with reference to FIG. 13 and FIG. 14.

An oriented film 802a is formed in the side of a TFT of a TFT array substrate 801 manufactured according to Embodiment 4. The oriented film 802a is formed by offset printing method. Polyimide resin is used as a material of the oriented film 802a. Instead of using polyimide resin, other resin which is derivative of polyamic acid may be used. Then, the oriented film 802a is subjected to a rubbing treatment so that liquid crystal molecules are oriented with a certain pre-tilt angle.

Subsequently, an opposite substrate 810 is formed. A light shielding film 812 is formed over a substrate 811. The light shielding film 812 is formed by using a chromium metal and subjected to photolithography or etching. A pixel electrode 813 is formed over the light shielding film 812. The pixel electrode is made of a transparent conductive film, namely, ITO and subjected to photolithography or etching. When a color filter 814 is provided between the light shielding film 812 and a pixel electrode 813, colored resin having a desired color is applied by spin coating method, and then exposed to light and developed. The above-described color filter formation process is repeated to provide each of color filters of R, C, and B 814a to 814c (not shown here). A passivation film 815 for planarization is formed in order to fill a step between the color filter 814 and the light shielding film 812. The passivation film 815 is formed by applying acrylic resin on the color filters. Materials that are useful for planarization may be used, instead of acrylic resin. When color filters are not provided, the passivation film 815 is not always required.

Over the thus formed opposite substrate, an oriented film 802b is formed. The oriented film 802b is formed over the opposite substrate by the same offset printing method as over the TFT array substrate. Polyimide resin is used as a material of the oriented film 802b. Instead of using polyimide resin, polyamide resin may be used. Then, the oriented film 802b is subjected to a rubbing treatment so that liquid crystal molecules are oriented with a certain pre-tilt angle. A sealing agent (not shown) is applied in the side of the opposite substrate to bond the opposite substrate and the TFT array substrate, and then the opposite substrate 810 is heated in an oven to temporarily cure the sealing agent. Thereafter, a spacer 816 of plastic sphere is sprayed in the side of the pixel electrode on the opposite substrate.

The TFT array substrate 801 and the opposite substrate 810 are bonded to each other with accuracy to manufacture a liquid crystal panel 817 in a manner that the side of the TFT of the TFT array substrate faces the side of the pixel electrode of the opposite substrate 810. Filler is mixed into the sealing agent, and thus, it is possible to bond the two substrates at an even interval by the filler and the spacer.

Unnecessary portion of the bonded substrates is cut off to form the liquid crystal panel 817 having a desired shape. A liquid crystal material 818 is injected into the inside of the liquid crystal panel 817. After the whole inside of the panel is filled with the liquid crystal material 818, the panel is completely sealed by using the sealing agent (not shown).

Figure 14:
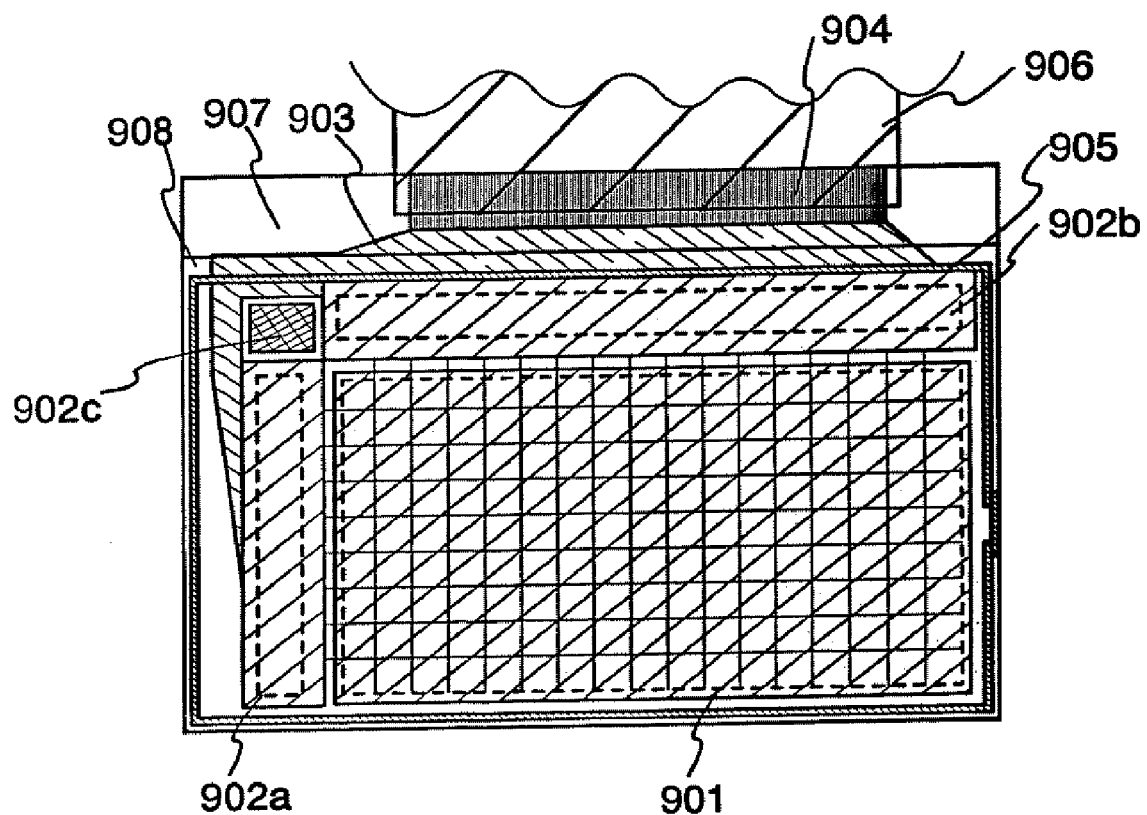
FIG. 14 is a top view showing an entire liquid crystal display device.

FIG. 14 shows a top view of the liquid crystal panel 817. A scanning signal driver circuit 902a and a video signal driver circuit 902b are provided in the periphery of a pixel portion 901. A logical operation circuit 902c such as a CPU or a memory is provided. The driver circuits are connected to an external input-output terminal portion 904 through connecting wirings group 903. In the pixel portion 901, gate wirings group extended from the scanning signal driver circuit 902a and data wirings group extended from the video signal driver circuit 902b are crossed in a matrix to form a pixel. A pixel TFT, a storage capacitor and a pixel electrode are provided for each of the pixels. A sealing agent 905 is formed between the outer side of the pixel portion 901 and the scanning signal driver circuit 902a and the video signal driver circuit 902b and a logical operation circuit 902c of the TFT array substrate 908 and the inner side of the external input-output terminal portion 904. In the outside of the liquid crystal panel 817, a flexible printed circuit 909 is connected to the external input-output terminal portion 904 and also to each driver circuit via the connecting wirings group 903. The external input-output terminal portion 904 is formed of the same conductive film as the data wirings. In the flexible printed circuit 906, copper wirings are formed in an organic resin film such as polyimide and connected to the external input-output terminal portion 904 by using an anisotropic conductive adhesive.

A polarization plate and a retardation film are provided in the side of the opposite substrate of the liquid crystal panel 817 so that a straight polarized light in the same direction as a director direction of liquid crystal molecules in a liquid crystal layer that is closest to the opposite substrate can be incident into. Further, a polarization plate and a retardation film are provided in the side of the TFT substrate of the liquid crystal panel 817 so that a light in the same direction as a director direction of liquid crystal molecules in a liquid crystal layer that is closest to the TFT substrate can be incident into.

By the above-mentioned method, a periphery circuit in which a central processing unit (CPU) is incorporated and a display are integrated in the same substrate to form a liquid crystal display. A cleaning process and a heat treatment process may be performed as necessary, although not described in this Embodiment.

Embodiment 6

According to the manufacturing method of a semiconductor device of the present invention, a system-on-panel in which a display screen (a display) and a periphery circuit in which a central processing unit (CPU) is incorporated are integrated can be formed. This makes it possible to shorten processes for manufacturing a display or inspection process, and thus, cost is reduced. Further, a display having multifunction can be downsized.

Figure 15:
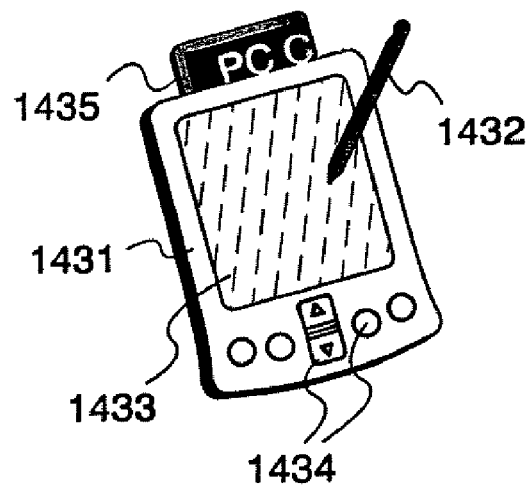
FIG. 15 is a sectional view showing an example of electric appliances equipped with a liquid crystal display device by the manufacturing method of a semiconductor device according to the present invention.

FIG. 15 shows an example of electric appliances equipped with a system-on-panel by the manufacturing method of a semiconductor device according to the present invention.

FIG. 15 shows a portable information terminal. A system-on-panel (display portion) 1433, an external interface 1435, operation switches 1434, and the like are provided for a main body 1431. As an attachment for the operation, a stylus pen 1432 may be used. In this manner, by mounting the system-on-panel 1433 on the portable information terminal, it is possible that information processing capabilities have multifunction, maintaining its downsized body.

Embodiment 7

A manufacturing method of a semiconductor device according to the present invention can be applied to a manufacturing process of a MOS transistor which is fabricated by using a silicon wafer of a bulk or a SOI wafer, in addition to a manufacturing process of a TFT. A description about this case is given hereinafter.

A gate insulating film is formed over a silicon wafer of a bulk that is element separated by LOCOS (Local Oxidation of Silicon), STI (Shallow Trench Isolation) or the like.

After forming the gate insulating film, a gate electrode, LDDs, a source (or a drain), an interlayer insulating film, wirings and the like are formed to form a MOS transistor according to the process after forming the gate insulating film 409 in Embodiment 1, 2 or 3.

However, unlike Embodiment 1 in which a glass substrate is used, higher temperature heat treatment than Embodiment 1 is possible in the present embodiment because of using a silicon wafer of a bulk (or SOI wafer) with heat resistance. Therefore, the condition of activation temperature is not limited to the condition in Embodiment 1, and can be changed as necessary.

According to the present invention, an element having an LDD structure is manufactured in a self-aligning manner by the means of preventing the degradation due to plasma. Such a manufacturing method requires the formation of an LDD in a self-aligning manner and is effective in manufacturing of miniaturized TFTs which is affected larger damage from plasma caused by becoming the surface area of gate electrodes thereof smaller. Also, the manufacturing method of a semiconductor device according to the present invention is applied to a MOS transistor or a LSI formed of MOS transistor as well as a TFT.

What is claimed is:

1. A method of manufacturing a semiconductor device, comprising the steps of:
    forming a conductive film over a gate insulating film;
    forming a first hard mask over the conductive film;
    doping a semiconductor film with an impurity at a high concentration while masking the semiconductor film with the first hard mask;
    forming a second hard mask by making the first hard mask shrink through etching after the high concentration impurity doping;
    forming a gate electrode by processing the conductive film while masking the conductive film with the second hard mask; and
    doping the semiconductor film with an impurity at a low concentration while masking the semiconductor film with the second hard mask after forming the gate electrode.

2. The method of manufacturing the semiconductor device, according to claim 1, wherein a material of the conductive film is selected from the group consisting of tantalum nitride and tungsten.

3. The method of manufacturing the semiconductor device, according to claim 1, wherein a material of the hard mask is silicon oxide.

4. A method of manufacturing a semiconductor device, comprising the steps of;
    forming a semiconductor film over a insulating substrate;
    forming a gate insulating film over the semiconductor film;
    forming a conductive film over the gate insulating film;
    forming a first hard mask over the conductive film;
    doping the semiconductor film with an impurity at a high concentration while masking the semiconductor film with the first hard mask;
    forming a second hard mask by making the first hard mask shrink through etching after the high concentration impurity doping;
    forming a gate electrode by processing the conductive film while masking the conductive film with the second hard mask; and
    doping the semiconductor film with an impurity at a low concentration while masking the semiconductor film with the second hard mask after forming the gate electrode.

5. The method of manufacturing the semiconductor device, according to claim 4, wherein a material of the conductive film is selected from the group consisting of tantalum nitride and tungsten.

6. The method of manufacturing the semiconductor device, according to claim 4, wherein a material of the hard mask is silicon oxide.

7. The method of manufacturing the semiconductor device, according to claim 4, wherein the semiconductor device comprises a display device formed over the insulating substrate and a peripheral circuit over the insulating substrate.

8. A method of manufacturing a semiconductor device, comprising the steps of:
forming a first conductive film over a gate insulating film;
forming a first hard mask over the first conductive film;
doping a semiconductor film with an impurity at a high concentration while masking the semiconductor film with the first hard mask;
forming a second hard mask by making the first hard mask shrink through etching after the high concentration impurity doping;
forming a gate electrode by processing the first conductive film while masking the first conductive film with the second hard mask; and
doping the semiconductor film with an impurity at a low concentration while masking the semiconductor film with the second hard mask after forming the gate electrode,
forming a contact hole in the second hard mask, after the step of forming the gate electrode, and
connecting a second conductive film with the gate electrode in the contact hole.

9. The method of manufacturing the semiconductor device, according to claim 8, wherein a material of the conductive film is selected from the group consisting of tantalum nitride and tungsten.

10. The method of manufacturing the semiconductor device, according to claim 8, wherein a material of the hard mask is silicon oxide.

11. A method of manufacturing a semiconductor device, comprising the steps of:
forming a semiconductor film over a insulating substrate;
forming a gate insulating film over the semiconductor film;
forming a first conductive film over the gate insulating film;
forming a first hard mask over the first conductive film;
doping the semiconductor film with an impurity at a high concentration while masking the semiconductor film with the first hard mask;
forming a second hard mask by making the first hard mask shrink through etching after the high concentration impurity doping;
forming a gate electrode by processing the first conductive film while masking the first conductive film with the second hard mask; and
doping the semiconductor film with an impurity at a low concentration while masking the semiconductor film with the second hard mask after forming the gate electrode,
forming a contact hole in the second hard mask, after the step of forming the gate electrode, and
connecting a second conductive film with the gate electrode in the contact hole.

12. The method of manufacturing the semiconductor device, according to claim 11, wherein a material of the first conductive film is selected from the group consisting of tantalum nitride and tungsten.

13. The method of manufacturing the semiconductor device, according to claim 11, wherein a material of the hard mask is of silicon oxide.

14. The method of manufacturing the semiconductor device, according to claim 11, wherein the semiconductor device comprises a display device formed over the insulating substrate and a peripheral circuit over the insulating substrate.

* * * * *